United States Patent
Cho et al.

(10) Patent No.: US 12,166,269 B2
(45) Date of Patent: Dec. 10, 2024

(54) ANTENNA AND ELECTRONIC DEVICE INCLUDING SAME

(71) Applicant: SAMSUNG ELECTRONICS CO., LTD., Suwon-si (KR)

(72) Inventors: Namjun Cho, Suwon-si (KR); Junghwan Son, Suwon-si (KR); Hyoseok Na, Suwon-si (KR); Youngju Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 237 days.

(21) Appl. No.: 17/648,217

(22) Filed: Jan. 18, 2022

(65) Prior Publication Data

US 2022/0263228 A1 Aug. 18, 2022

Related U.S. Application Data

(63) Continuation of application No. PCT/KR2022/000647, filed on Jan. 13, 2022.

(30) Foreign Application Priority Data

Feb. 18, 2021 (KR) .................. 10-2021-0022188
Jun. 18, 2021 (KR) .................. 10-2021-0079616

(51) Int. Cl.
*H01Q 1/24* (2006.01)
*H01Q 1/38* (2006.01)
(Continued)

(52) U.S. Cl.
CPC ............ *H01Q 1/243* (2013.01); *H01Q 1/38* (2013.01); *H01Q 1/24* (2013.01); *H01Q 13/02* (2013.01); *H01Q 21/06* (2013.01)

(58) Field of Classification Search
CPC ........... H01Q 1/243; H01Q 1/38; H01Q 1/24; H01Q 13/02; H01Q 21/06
See application file for complete search history.

(56) References Cited

U.S. PATENT DOCUMENTS 6,255,899 B1   7/2001   Bertin et al.
9,196,958 B2  11/2015   Arnold et al.
(Continued)

FOREIGN PATENT DOCUMENTS

CN    111865357 B        11/2021
JP    2006238204 A   *   9/2006   ........... H01Q 1/2283
(Continued)

OTHER PUBLICATIONS

International Search Report dated Apr. 28, 2022 for PCT/KR2022/000647.
(Continued)

*Primary Examiner* — Joseph J Lauture
(74) *Attorney, Agent, or Firm* — NIXON & VANDERHYE P.C.

(57) ABSTRACT

Various embodiments of the disclosure relate to an electronic device including an antenna. The electronic device may include: a housing; a main board disposed in an internal space of the housing and including a first surface oriented in a first direction, a second surface facing a direction opposite the first direction, and a through hole; and an antenna module disposed on the main board. The antenna module may include: a board at least partially disposed in the through hole and including a plurality of antenna elements; and a wireless communication circuit configured to transmit and/or receive a wireless signal in a predetermined frequency band via the plurality of antenna elements, the wireless communication circuit disposed on the second surface of the main board.

20 Claims, 32 Drawing Sheets

(51) Int. Cl.
*H01Q 13/02* (2006.01)
*H01Q 21/06* (2006.01)

(56) References Cited

U.S. PATENT DOCUMENTS

| | | |
|---|---|---|
| 10,205,224 B2 | 2/2019 | Mow et al. |
| 2009/0256752 A1 | 10/2009 | Akkermans et al. |
| 2012/0044122 A1 | 2/2012 | An et al. |
| 2013/0015563 A1 | 1/2013 | Lee et al. |
| 2016/0359461 A1 | 12/2016 | He et al. |
| 2018/0351262 A1 | 12/2018 | Yoon et al. |
| 2019/0139915 A1 | 5/2019 | Dalmia et al. |
| 2019/0173160 A1 | 6/2019 | Mow et al. |
| 2020/0194879 A1 | 6/2020 | Lim et al. |
| 2020/0403299 A1 | 12/2020 | Gupta et al. |

FOREIGN PATENT DOCUMENTS

| | | |
|---|---|---|
| JP | 2020-102706 A | 7/2020 |
| KR | 10-1044615 B1 | 6/2011 |
| KR | 10-2019-0117966 A | 10/2019 |
| KR | 10-2020-0073745 A | 6/2020 |
| WO | WO 2022/177163 A1 | 8/2022 |

OTHER PUBLICATIONS

International PCT Written Opinion dated Apr. 28, 2022 for PCT/KR2022/000647.
Notification of the Publication of the International Application No.
Extended European Search Report dated Nov. 3, 2022 for EP Application No. 22700166.6.
Office Action for SG Application No. 11202305039U dated Sep. 30, 2024, 7 pages.

* cited by examiner

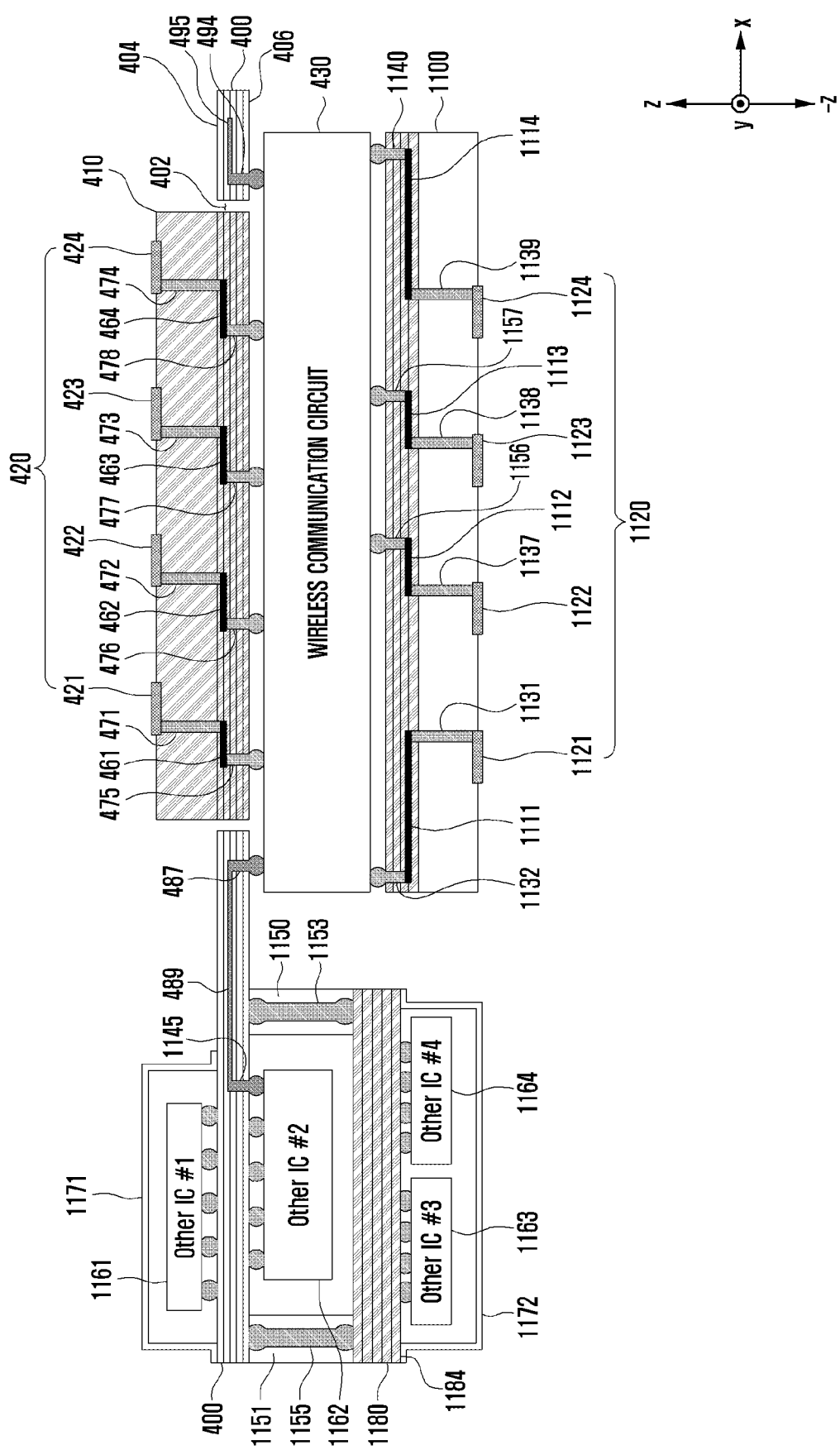

ANTENNA AND ELECTRONIC DEVICE INCLUDING SAME

CROSS-REFERENCE TO RELATED APPLICATIONS

This application is a continuation of International Application No. PCT/KR2022/000647 designating the United States, filed on Jan. 13, 2022 in the Korean Intellectual Property Receiving Office and claiming priority to Korean Patent Application No. 10-2021-0022188, filed Feb. 18, 2021 in the Korean Intellectual Property Office, and Korean Patent Application No. 10-2021-0079616, filed Jun. 18, 2021, in the Korean Intellectual Property Office, the disclosures of all of which are incorporated by reference herein in their entireties.

BACKGROUND

Field

The disclosure relates to an antenna and an electronic device including the same.

Description of Related Art

With the development of wireless communication technology, electronic devices (e.g., electronic devices for communication) are commonly used in daily life, and thus use of contents is increasing exponentially. Due to the rapid increase of use of contents, network capacity is gradually reaching the limit thereof. After the commercialization of 4G (4th generation) communication systems, in order to meet the increasing demand for wireless data traffic, communication systems (e.g., a 5G (5th generation) communication system, a pre-5G communication system, or a new radio (NR)) that transmit and/or receive signals using a high-frequency band (e.g., the mmWave band in the range of about 3 GHz to about 300 GHz)) have been and are being researched.

An electronic device may include an antenna capable of transmitting and/or receiving signals using a frequency of a high-frequency band (e.g., the mmWave band in the range of about 3 GHz to 300 GHz). Antennas (e.g., antenna modules) are being developed to have efficient mounting structures for overcoming a free space loss due to characteristics of a high-frequency band and increasing the gain and developed in various types corresponding to the efficient mounting structures. The antennas (e.g., antenna modules) may include an array antenna in which a variable number of antenna elements (e.g., conductive patches and/or conductive patterns) are arranged at regular intervals on a dielectric structure (e.g., a substrate).

An electronic device may include a wireless communication circuit (e.g., a radio frequency front end (RFFE)) for substantially simultaneously transmitting and/or receiving signals through a plurality of antenna elements included in an array antenna. The wireless communication circuit may include a plurality of amplifier circuits (e.g., a power amplifier (PA) and/or a low noise amplifier (LNA)) and/or a plurality of frequency converters (e.g., a mixer and/or a phase lock loop (PLL)) in order to transmit and/or receive signals through each antenna element. As the structure of a wireless communication circuit (e.g., an RFFE) becomes relatively more complex, a relatively larger physical region may be required.

As electronic devices become slim, the sizes of the internal spaces of the electronic devices decrease. Thus, it may be difficult to secure a space for arranging an array antenna and/or a wireless communication circuit.

SUMMARY

Various embodiments of the disclosure disclose a device and method for reducing the size of a space (e.g., a physical region) in which an antenna (e.g., an antenna module) and/or a wireless communication circuit are disposed in an electronic device.

According to various example embodiments, an electronic device includes: a housing; a main board disposed in an internal space of the housing and including a first surface oriented in a first direction, a second surface facing a second direction opposite the first direction, and a hole or opening; and an antenna module disposed in the main board. The antenna module includes: a board at least partially disposed in the hole and including a plurality of antenna elements; and a wireless communication circuit configured to transmit and/or receive a wireless signal in a predetermined frequency band via the plurality of antenna elements on the second surface of the main board.

According to various example embodiments, an electronic device includes: a housing; a main board disposed in an internal space of the housing and including a first surface oriented in a first direction, a second surface facing a second direction opposite the first direction, and a through hole; and an antenna module disposed on the main board. The antenna module includes: a board including a plurality of antenna elements; and a wireless communication circuit at least partially disposed in the through hole and electrically connected to the board, the wireless communication circuit being configured to transmit and/or receive a wireless signal in a predetermined frequency band via the plurality of antenna elements.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIGS. 11A and 11B are cross-sectional views each schematically illustrating an example structure of an antenna module including a plurality of array antennas according to various embodiments;

DETAILED DESCRIPTION

Hereinafter, various example embodiments will be described in greater detail with reference to attached drawings.

Figure 1:
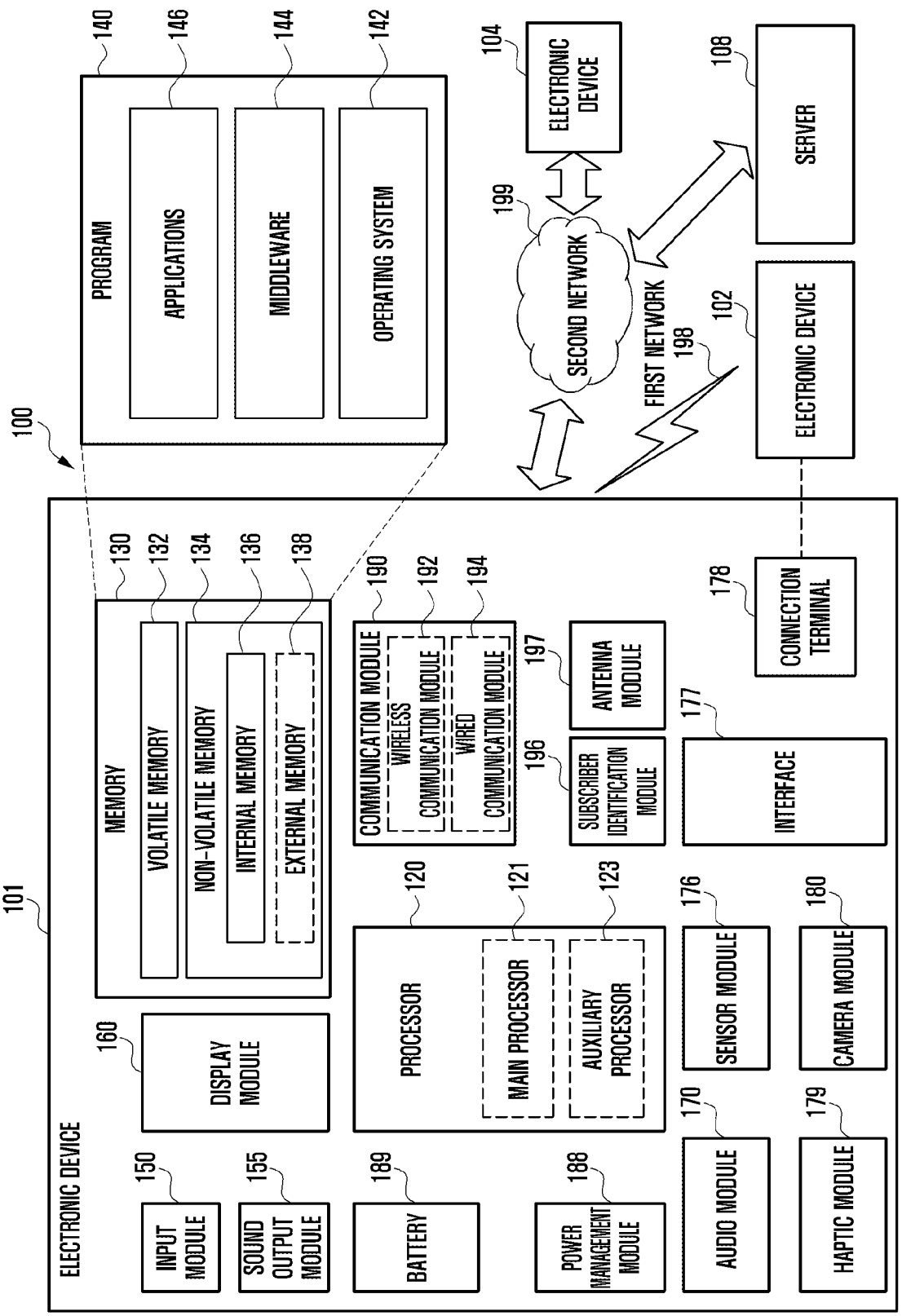
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band. For example, the plurality of antennas may include a patch array antenna and/or a dipole array antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. It is intended that features described with respect to separate embodiments, or features recited in separate claims, may be combined unless such a combination is explicitly specified as being excluded or such features are incompatible.

With regard to the description of the drawings, similar reference numerals may be used to refer to similar or related elements.

It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
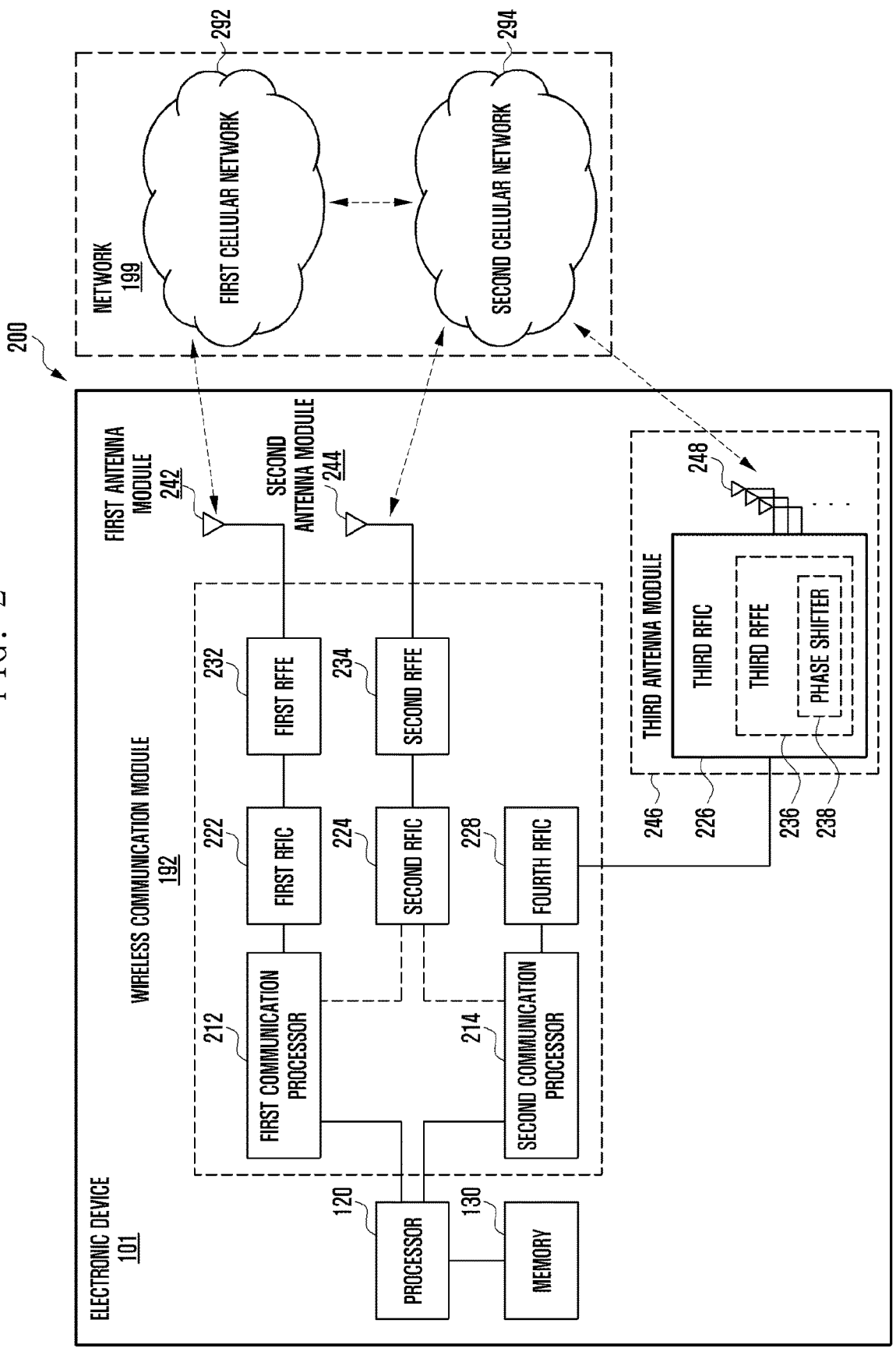
FIG. 2 is a block diagram illustrating an electronic device configured to support legacy network communication and 5G network communication according to various embodiments.

FIG. 2 is a block diagram 200 of an electronic device 101 supporting legacy network communication and 5G network communication according to various embodiments.

Referring to FIG. 2, according to various embodiments, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may include the processor 120 and the memory 130. The network 199 may include a first network 292 and a second network 294. According to an embodiment, the electronic device 101 may further include at least one component among the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may be at least a part of the wireless communication module 192. According to an embodiment, the fourth RFIC 228 may be omitted, or may be included as a part of the third RFIC 226.

The first communication processor 212 may include various processing circuitry and establish a communication channel of a band to be used for wireless communication with the first network 292, and may support legacy network communication via the established communication channel. According to an embodiment, the first network may be a legacy network including second generation (2G), third generation (3G), fourth generation (4G), or long-term evolution (LTE) network. The second communication processor 214 may include various processing circuitry and establish a communication channel corresponding to a designated band (e.g., approximately 6 GHz to 60 GHz) among bands to be used for wireless communication with the second network 294, and may support 5G network communication via the established communication channel. According to an embodiment, the second network 294 may be a 5G network (e.g., new radio (NR)) defined in 3GPP. In addition, according to an embodiment, the first communication processor 212 or the second communication processor 214 may establish a communication channel corresponding to another designated band (e.g., approximately 6 GHz or less) among bands to be used for wireless communication with the second network 294, and may support 5G network communication via the established communication channel. According to an embodiment, the first communication processor 212 and the second communication processor 214 may be implemented in a single chip or a single package. According to an embodiment, the first communication processor 212 or the second communication processor 214 may be implemented in a single chip or a single package, together with the processor 120, the sub-processor 123, or the communication module 190.

According to an embodiment, the first communication processor 212 may perform data transmission or reception with the second communication processor 214. For example, data which has been classified to be transmitted via the second network 294 may be changed to be transmitted via the first network 292.

In this instance, the first communication processor 212 may receive transmission data from the second communication processor 214. For example, the first communication processor 212 may perform data transmission or reception with the second communication processor 214 via an inter-processor interface. The inter-processor interface may be implemented as, for example, a universal asynchronous receiver/transmitter (UART) (e.g., a high speed-UART (HS-UART)) or a peripheral component interconnect bus express (PCIe), but the type of interface is not limited thereto. For example, the first communication processor 212 and the second communication processor 214 may exchange control information and packet data information using, for example, a shared memory. For example, the first communication processor 212 may perform transmission or reception of various types of information such as sensing information, information associated with an output strength, and resource block (RB) allocation information, with the second communication processor 214.

Depending on implementation, the first communication processor 212 may not be directly connected to the second communication processor 214. In this instance, the first communication processor 212 may perform data transmission or reception with the second communication processor 214, via the processor 120 (e.g., an application processor). For example, the first communication processor 212 and the second communication processor 214 may perform data transmission or reception via the processor 120 (e.g., an application processor) and a HS-UART interface or a PCIe interface, but the type of interface is not limited. For example, the first communication processor 212 and the second communication processor 214 may exchange control information and packet data information using the processor 120 (e.g., an application processor) and a shared memory. According to an embodiment, the first communication processor 212 and the second communication processor 214 may be implemented in a single chip or a single package. According to various embodiments, the first communication processor 212 or the second communication processor 214 may be implemented in a single chip or a single package, together with the processor 120, the sub-processor 123, or the communication module 190.

In the case of transmission, the first RFIC 222 may convert a baseband signal generated by the first communication processor 212 into a radio frequency (RF) signal in the range of approximately 700 MHz to 3 GHz, which is used in the first network 292 (e.g., a legacy network). In the case of reception, an RF signal is obtained from the first network 292 (e.g., a legacy network) via an antenna (e.g., the first antenna module 242), and may be preprocessed via an RFFE (e.g., the first RFFE 232). The first RFIC 222 may convert the preprocessed RF signal into a baseband signal so that the baseband signal is processed by the first communication processor 212.

In the case of transmission, the second RFIC 224 may convert a baseband signal generated by the first communication processor 212 or the second communication processor 214 into an RF signal (hereinafter, a 5G Sub6 RF signal) in an Sub6 band (e.g., approximately 6 GHz or less) used in the second network 294 (e.g., a 5G network). In the case of reception, a 5G Sub6 RF signal may be obtained from the second network 294 (e.g., a 5G network) via an antenna (e.g., the second antenna module 244), and may be preprocessed by an RFFE (e.g., the second RFFE 234). The second RFIC 224 may convert the preprocessed 5G Sub6 RF signal into a baseband signal so that the signal may be processed by a corresponding communication processor among the first communication processor 212 or the second communication processor 214.

The third RFIC 226 may convert a baseband signal generated by the second communication processor 214 into an RF signal (hereinafter, a 5G Above6 RF signal) of a 5G Above6 band (e.g., approximately 6 GHz to 60 GHz) to be used in the second network 294 (e.g., a 5G network). In the case of reception, a 5G Above6 RF signal is obtained from the second network 294 (e.g., a 5G network) via an antenna (e.g., the antenna 248), and may be preprocessed by the third RFFE 236. The third RFIC 226 may convert the preprocessed 5G Above6 RF signal into a baseband signal so that the signal is processed by the second communication processor 214. According to an embodiment, the third RFFE 236 may be implemented as a part of the third RFIC 226.

According to an embodiment, the electronic device 101 may include the fourth RFIC 228, separately from or, as a part of, the third RFIC 226. In this instance, the fourth RFIC 228 may convert a baseband signal produced by the second communication processor 214 into an RF signal (hereinafter, an IF signal) in an intermediate frequency band (e.g., approximately 9 GHz to 11 GHz), and may transfer the IF signal to the third RFIC 226. The third RFIC 226 may convert the IF signal into a 5G Above6 RF signal. In the case of reception, a 5G Above6 RF signal may be received from the second network 294 (e.g., a 5G network) via an antenna (e.g., the antenna 248), and may be converted into an IF signal by the third RFIC 226. The fourth RFIC 228 may convert the IF signal into a baseband signal so that the second communication processor 214 is capable of processing the baseband signal.

According to an embodiment, the first RFIC 222 and the second RFIC 224 may be implemented as at least a part of a single chip or a single package. According to an embodiment, the first RFFE 232 and the second RFFE 234 may be implemented as at least a part of a single chip or single package. According to an embodiment, at least one of the first antenna module 242 or the second antenna module 244 may be omitted or may be combined with another antenna module, so as to process RF signals of a plurality of corresponding bands.

According to an embodiment, the third RFIC 226 and the antenna 248 may be disposed in the same substrate, and may form a third antenna module 246. For example, the wireless communication module 192 or the processor 120 may be disposed in a first substrate (e.g., a main PCB). In this instance, the third RFIC 226 is disposed in a part (e.g., a lower part) of a second substrate (e.g., a sub PCB) different from the first substrate, and the antenna 248 is disposed in another part (e.g., an upper part), so that the third antenna module 246 may be formed. By disposing the third RFIC 226 and the antenna 248 in the same substrate, the length of a transmission line therebetween may be reduced. For example, this may reduce a loss (e.g., a diminution) of a high-frequency band signal (e.g., approximately 6 GHz to 60 GHz) used for 5G network communication, the loss being caused by a transmission line. Accordingly, the electronic device 101 may improve the quality or speed of communication with the second network 294 (e.g., a 5G network).

According to an embodiment, the antenna 248 may be implemented as an antenna array including a plurality of antenna elements which may be used for beamforming. In this instance, the third RFIC 226, for example, may include a plurality of phase shifters 238 corresponding to a plurality of antenna elements, as a part of the third RFFE 236. In the case of transmission, each of the plurality of phase shifters 238 may shift the phase of a 5G Above6RF signal to be transmitted to the outside of the electronic device 101 (e.g., a base station of a 5G network) via a corresponding antenna element. In the case of reception, each of the plurality of phase shifters 238 may shift the phase of a 5G Above6 RF signal received from the outside via a corresponding antenna element into the same or substantially the same phase. This may enable transmission or reception via beamforming between the electronic device 101 and the outside.

The second network 294 (e.g., a 5G network) may operate independently (e.g., Standalone (SA)) from the first network 292 (e.g., a legacy network), or may operate by being connected thereto (e.g., Non-Standalone (NSA)). For example, in the 5G network, only an access network (e.g., 5G radio access network (RAN) or next generation RAN (NG RAN)) may exist, and a core network (e.g., next generation core (NGC)) may not exist. In this instance, the electronic device 101 may access the access network of the 5G network, and may access an external network (e.g., the Internet) under the control of the core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by another component (e.g., the processor 120, the first communication processor 212, or the second communication processor 214).

Figure 3A:
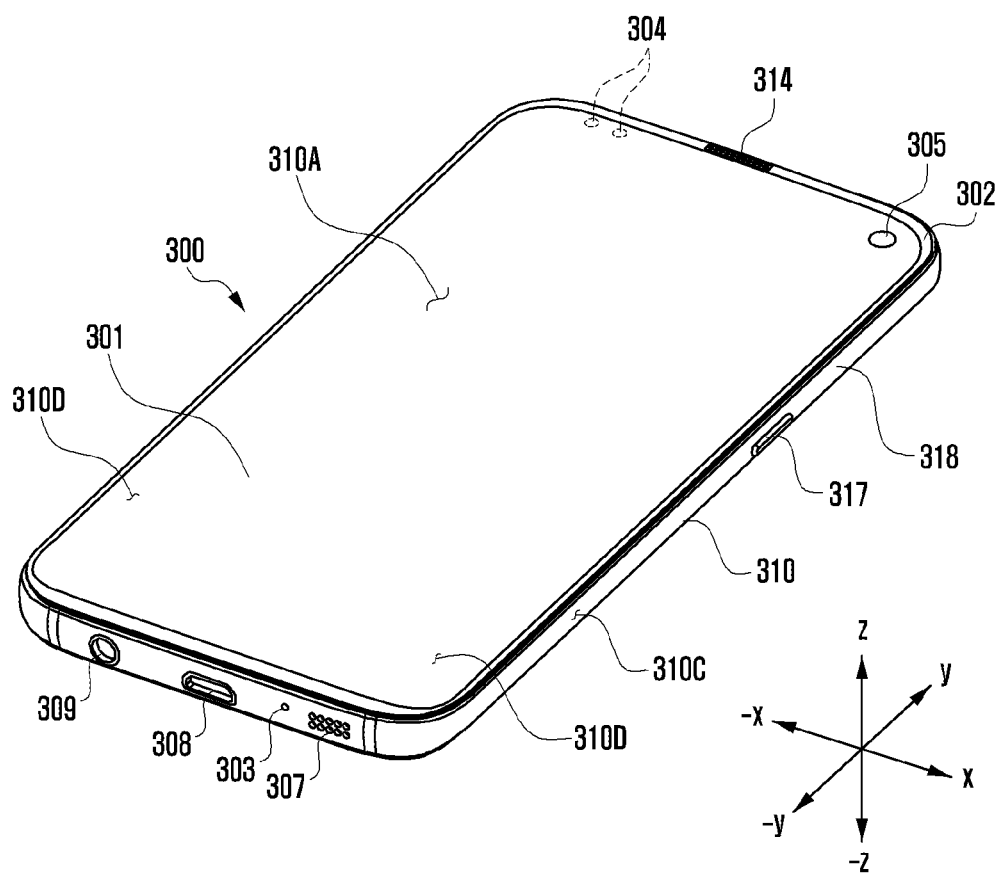
FIG. 3A is a front perspective view of a mobile electronic device according to various embodiments.
Figure 3B:
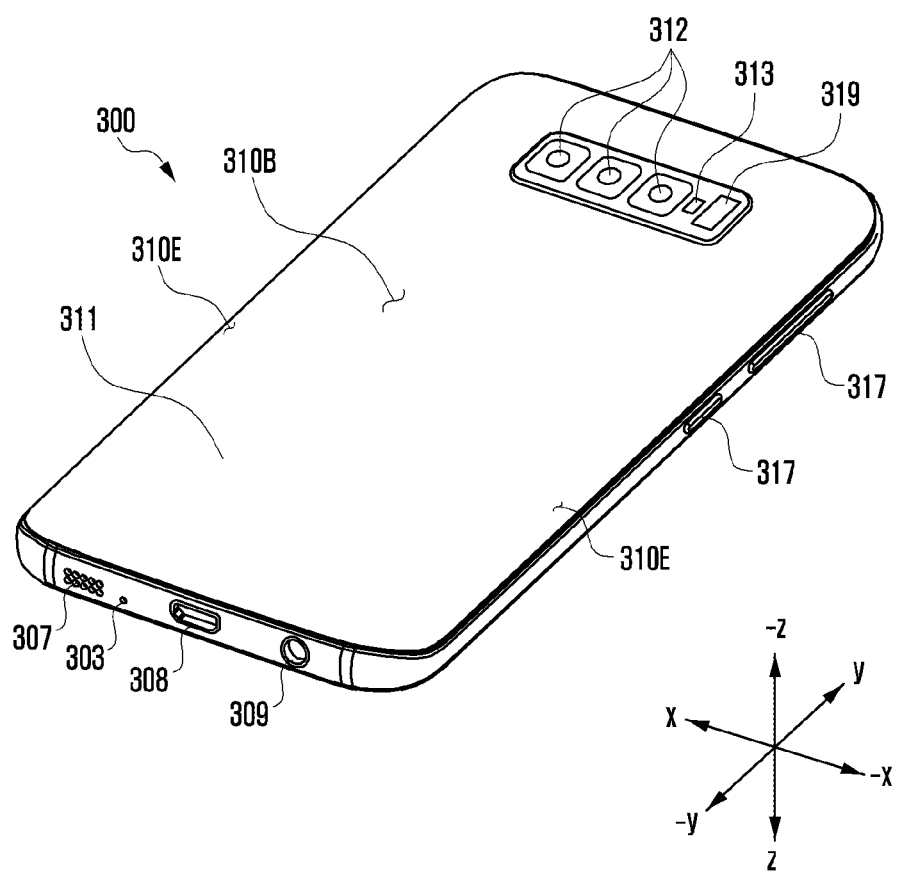
FIG. 3B is a rear perspective view of a mobile electronic device according to various embodiments.

FIG. 3A is a front perspective view of an electronic device 300 according to various embodiments. FIG. 3B is a rear perspective view of the electronic device 300 according to various embodiments. The electronic device 300 in FIGS. 3A and 3B may be at least partially similar to the electronic device 101 of FIG. 1 or FIG. 2, or may include various embodiments of the electronic device.

Referring to FIGS. 3A and 3B, the electronic device 300 (e.g., the electronic device 101 in FIG. 1) according to various embodiments may include a housing 310 including a first surface (or a front surface) 310A, a second surface (or a rear surface) 310B, and a side surface 310C surrounding the space (or the internal space) between the first surface 310A and the second surface 310B. In an embodiment (not illustrated), the term "housing 310" may refer, for example, to a structure forming a part of the first surface 310A, the second surface 310B, and the side surface 310C. According to an embodiment, at least a portion of the first surface 310A may be defined by a substantially transparent front plate 302 (e.g., a glass plate or a polymer plate including various coating layers). The second surface 310B may be defined by a substantially opaque rear plate 311. The rear plate 311 may be made of, for example, coated or colored glass, ceramic, a polymer, or a metal (e.g., aluminum, stainless steel (STS), or magnesium), or a combination of two or more of the above-mentioned materials. The side surface 310C may be defined by a side bezel structure (or a "side member") 318 coupled to the front plate 302 and the rear plate 311 and including a metal and/or a polymer. In some embodiments, the rear plate 311 and the side bezel structure 318 may be integrally configured, and may include the same material (e.g., a metal material such as aluminum).

According to various embodiments, the front plate 302 may include, at the long opposite side edges thereof, first regions 310D, which are bent from the first surface 310A toward the rear plate 311 and extend seamlessly. In the illustrated embodiment (see FIG. 3B), the rear plate 311 may include, at the long opposite side edges thereof, second regions 310E, which are bent from the second surface 310B toward the front plate 302 and extend seamlessly. In various embodiments, the front plate 302 (or the rear plate 311) may include only one of the first regions 310D (or the second regions 310E). In an embodiment, the front plate 302 (or the rear plate 311) may not include a part of the first regions 310D (or the second regions 310E). In an embodiment, when viewed from a side of the electronic device 300, the side bezel structure 318 may have a first thickness (or width) on the side surface portions where the first regions 310D or the second regions 310E are not included, and may have a second thickness (or width), which is smaller than the first thickness, on the side surface portions where the first regions 310D or the second regions 310E are included.

According to an embodiment, the electronic device 300 may include at least one of a display 301, audio modules 303, 307, and 314, sensor modules 304 and 319, camera modules 305, 312, and 313, key input devices 317, an indicator (not illustrated), and connector holes 308 and 309. In some embodiments, in the electronic device 300, at least one of the components (e.g., the key input devices 317, the indicator, or the connector holes 308 and 309) may be omitted, or other components may be additionally included.

According to various embodiments, the display 301 may be viewable through a substantial portion of the front plate 302. In some embodiments, at least a part of the display 301 may be viewable through the front plate 302 defining the first surface 310A and the first regions 310D of the side surface 310C. In some embodiments, the edges of the display 301 may be configured to be substantially the same as the shape of the periphery of the front plate 302 adjacent thereto. In an embodiment (not illustrated), the distance between the periphery of the display 301 and the periphery of the front plate 302 may be substantially constant in order to enlarge the exposed area of the display 301.

In an embodiment (not illustrated), a recess or an opening may be disposed in a part of the screen display region of the display 301, and at least one of an audio module 314, a sensor modules 304, a camera module 305, or an indicator aligned with the recess or the opening may be included. In an embodiment (not illustrated), on the rear surface of the screen display region of the display 301, at least one of the audio module 314, the sensor module 304, the camera module 305, or the indicator may be included. For example, the audio module 314, the camera module 305, the sensor module 304 and/or the indicator may be disposed in the internal space in the electronic device 300 to be in contact with the external environment through an opening perforated in the display 301 up to the front plate 302. As another example, some of the sensor modules 304, the camera module 305 and/or the indicator may be disposed in the internal space in the electronic device 300 so as to perform the functions thereof without being viewable through the front plate 302. For example, a region of the display 301 facing the sensor module 304, the camera module 305, and/or the indicator may not require a perforated opening.

In an embodiment (not illustrated), the display 301 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 304 and 319 and/or at least some of the key input devices 317 may be disposed in the first regions 310D and/or the second regions 310E.

According to various embodiments, the audio modules 303, 307, and 314 may include a microphone hole 303 and speaker holes 307 and 314. The microphone hole 303 may include a microphone disposed therein so as to acquire external sound, and in some embodiments, multiple microphones disposed therein so as to detect the direction of sound. The speaker holes 307 and 314 may include an external speaker hole 307 and a phone call receiver hole 314. In some embodiments, the speaker holes 307 and 314 and the microphone hole 303 may be implemented as a single hole, or a speaker free of speaker holes 307 and 314 (e.g., a piezo speaker) may be included.

According to various embodiments, the sensor modules 304 and 319 may generate electrical signals or a data value corresponding to the internal operating state of the electronic device 300 or an external environmental state. The sensor modules 304 and 319 may include, for example, a first sensor module 304 (e.g., a proximity sensor) and/or a second sensor module (not illustrated) (e.g., a fingerprint sensor) disposed on the first surface 310A of the housing 310, and/or a third sensor module 319 (e.g., an HRM sensor) disposed on the second surface 310B of the housing 310. A fingerprint sensor may be disposed not only on the first surface 310A (e.g., the display 301) of the housing 310, but also on the second surface 310B. For example, a fingerprint sensor (e.g., an ultrasonic fingerprint sensor or an optical fingerprint sensor) may be disposed below the display 301 of the first surface 310A. The electronic device 300 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 304.

According to various embodiments, the camera modules 305, 312, and 313 may include, for example, a first camera device 305 disposed on the first surface 310A of the electronic device 300 and a second camera device 312 and/or a flash 313 disposed on the second surface 310B of the electronic device 300. The camera modules 305 and 312 may include one or more lenses, an image sensor, and/or an image signal processor. The flash 313 may include, for example, a light-emitting diode or a xenon lamp. In some embodiments, two or more lenses (e.g., an infrared camera, a wide-angle lens, and a telephoto lens), and image sensors may be disposed on one surface of the electronic device 300.

According to various embodiments, the key input devices 317 may be disposed on the side surface 310C of the housing 310. In an embodiment, the electronic device 300 may not include some or all of the key input devices 317, and a key input device 317 not included in the electronic device 300 may be implemented in the form of a soft key on the display 301. In some embodiments, a key input device 317 may be implemented using a pressure sensor included in the display 301.

According to various embodiments, an indicator (not illustrated) may be disposed on the first surface 310A of the housing 310. The indicator may provide, for example, the status information of the electronic device 300 in an optical form. In an embodiment, the indicator may provide, for example, a light source that is interlocked with the operation of the camera module 305. The indicator may include, for example, an LED, an IR LED, and a xenon lamp.

According to various embodiments, the connector holes 308 and 309 may include a first connector hole 308 capable of accommodating a connector (e.g., a USB connector) for transmitting/receiving power and/or data to/from an external electronic device, and/or a second connector hole 309 capable of accommodating a connector (e.g., an earphone jack) for transmitting/receiving an audio signal to/from an external electronic device.

Figure 3C:
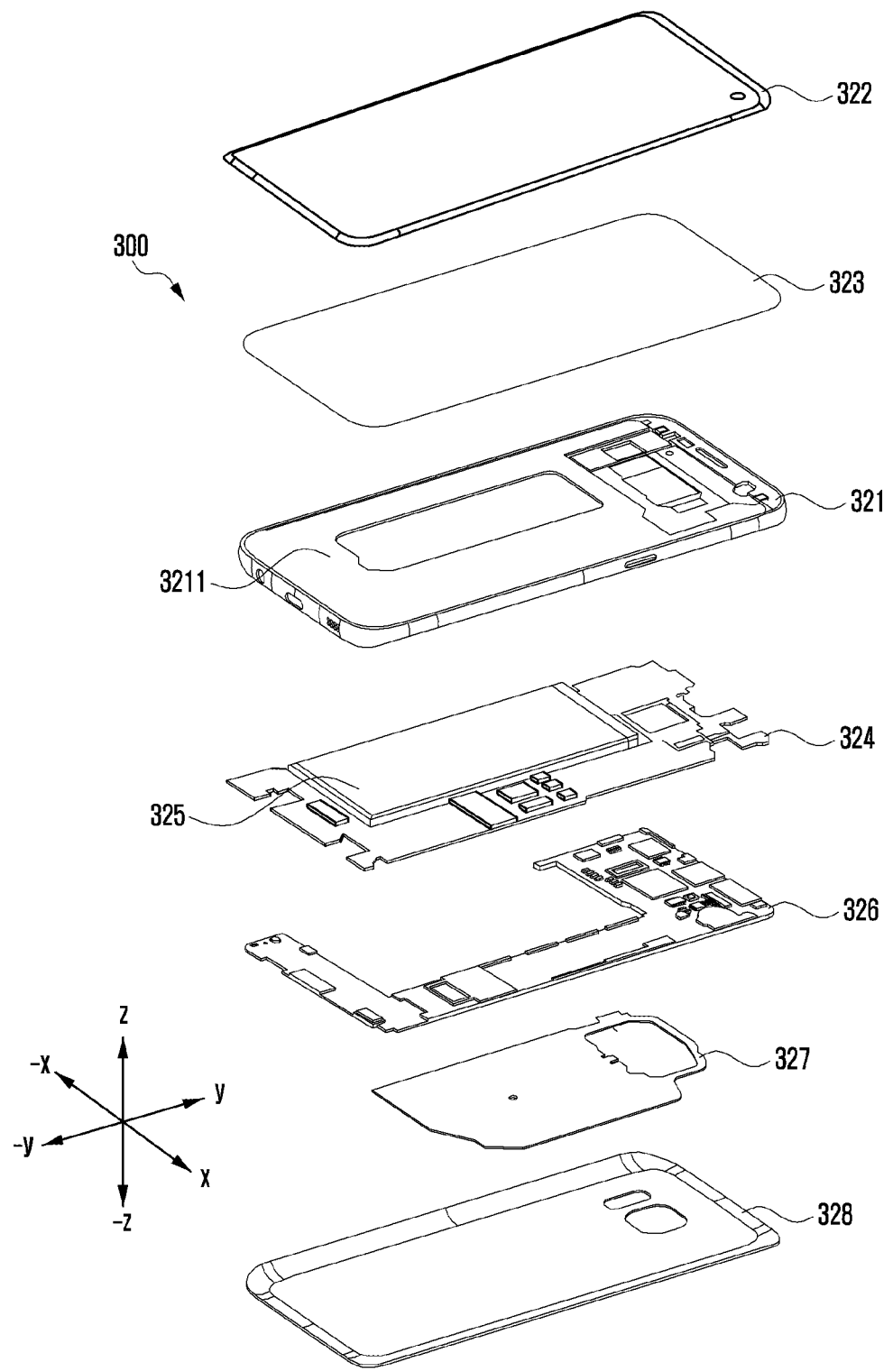
FIG. 3C is an exploded perspective view of a mobile electronic device according to various embodiments.

FIG. 3C is an exploded perspective view of the electronic device 300 according to various embodiments.

Referring to FIG. 3C, according to various embodiments, the electronic device 300 may include a side bezel structure 321, a first support member 3211 (e.g., a bracket), a front plate 322, a display 323, a printed circuit board 324 (e.g., a main board), a battery 325, a second support member 326 (e.g., a rear case), an antenna 327, and a rear plate 328. In some embodiments, at least one of the components (e.g., the first support member 3211 or the second support member 326) may be omitted from the electronic device 300, or other components may be additionally included in the electronic device 300. At least one of the components of the electronic device 300 may be the same as or similar to at least one of the components of the electronic device 300 of FIG. 3A or FIG. 3B, and a redundant description thereof may not be repeated here.

According to various embodiments, the first support member 3211 may be disposed inside the electronic device 300, and the first support member 332 may be connected to the side bezel structure 321, or may be integrated with the side bezel structure 321. The first support member 3211 may be made of, for example, a metal material and/or a non-metal material (e.g., a polymer). The display 323 may be coupled to one surface of the first support member 3211, and the printed circuit board 324 may be coupled to the other surface of the first support member 332. A processor (e.g., the processor 120 in FIG. 1), a memory (e.g., the memory 130 in FIG. 1), and/or an interface (e.g., the interface 177 in FIG. 1) may be mounted on the printed circuit board 324. The processor may include at least one of, for example, a central processing unit, an application processor, a graphics processor, an image signal processor, a sensor hub processor, a communication processor, or the like.

The memory may include, for example, a volatile memory (e.g., the volatile memory 132 in FIG. 1) or a nonvolatile memory (e.g., the nonvolatile memory 134 in FIG. 1).

The interface may include, for example, a high-definition multimedia interface (HDMI), a universal serial bus (USB) interface, an SD card interface, and/or an audio interface. The interface may electrically or physically connect, for example, the electronic device 300 to an external electronic device, and may include a USB connector, an SD card/MMC connector, or an audio connector.

According to various embodiments, the battery 325 may include a device for supplying power to at least one component of the electronic device 300 and may include, for example, a non-rechargeable primary battery, a rechargeable secondary battery, or a fuel cell. At least a portion of the battery 325 may be disposed on substantially the same plane as, for example, the printed circuit board 324. The battery 325 may be integrally disposed inside the electronic device 300, or may be detachably disposed on the electronic device 300.

According to various embodiments, the antenna 327 may be disposed between the rear plate 328 and the battery 325. The antenna 327 may include, for example, a near field communication (NFC) antenna, a wireless charging antenna, and/or a magnetic secure transmission (MST) antenna, or the like. The antenna 327 may perform short-range communication with, for example, an external electronic device, or may transmit/receive power required for charging to/from the external device in a wireless manner. In an embodiment, an antenna structure may be constituted with a part of the side bezel structure 321 and/or the first support member 3211, or a combination thereof.

According to various embodiments, the electronic device 300 may have a bar-type or plate-type appearance, but the appearance of the electronic device 300 is not limited thereto. For example, the electronic device 300 may be a part of a foldable electronic device, a slidable electronic device, a stretchable electronic device, and/or a rollable electronic device.

Figure 4A:
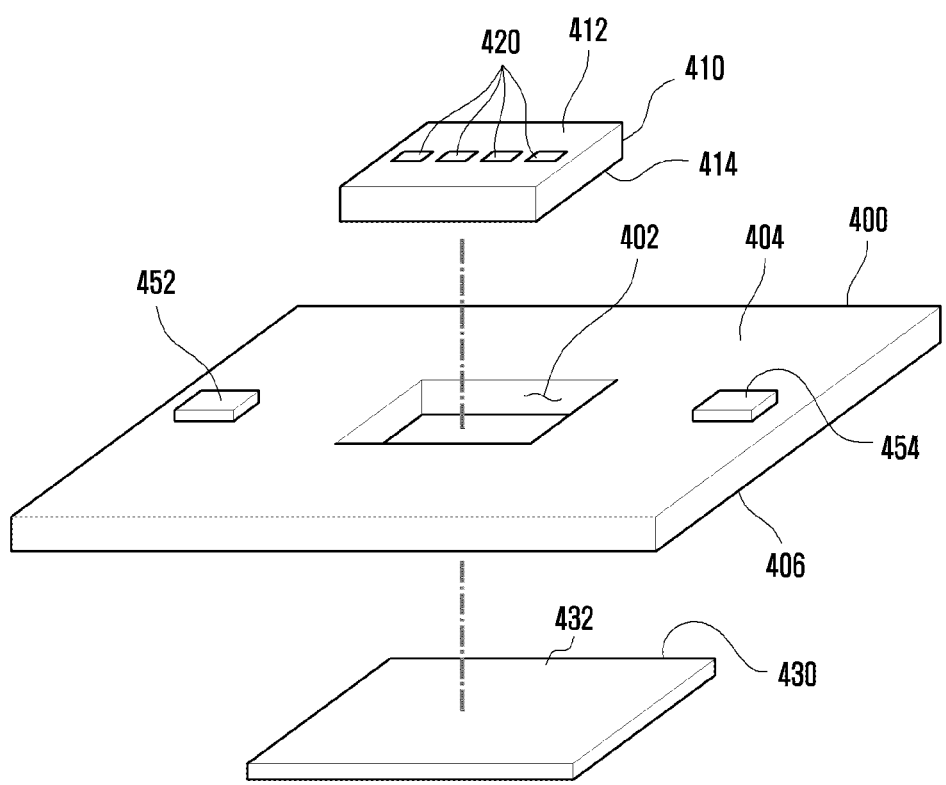
FIGS. 4A and 4B are diagrams illustrating an example structure of an antenna module according to various embodiments.
Figure 4B:
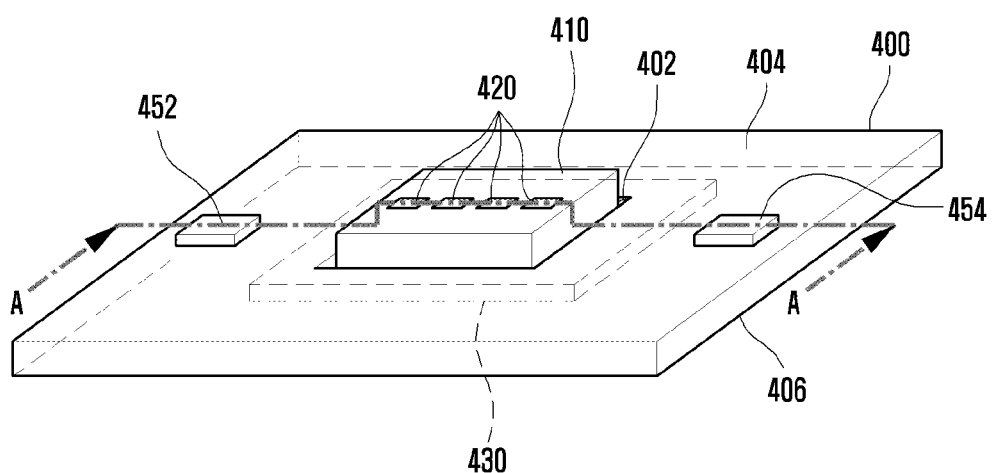
Figure 4B:
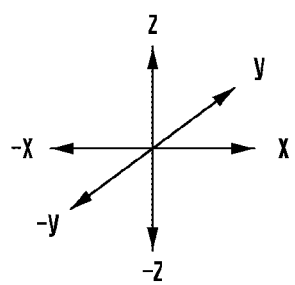

FIGS. 4A and 4B are diagrams illustrating an example structure of an antenna module according to various embodiments. According to an embodiment, the antenna module of FIGS. 4A and 4B may be at least partially similar to the third antenna module 246 of FIG. 2, or may include various embodiments of the antenna module.

According to various embodiments to be described with reference to FIGS. 4A and 4B, the antenna module may include a first board 410 including a plurality of antenna elements 420 and a wireless communication circuit 430 electrically connected to the first board 410.

According to various embodiments, the first board 410 may include, for example, and without limitation, a plurality of conductive layers and a plurality of non-conductive layers alternately stacked with the conductive layers. The first board 410 may provide an electrical connection between various electronic components disposed on the first board 410 and/or outside the first board 410 using, for example, wiring lines and conductive vias provided in the conductive layers.

According to various embodiments, the first board 410 may include a plurality of antenna elements 420 arranged at predetermined intervals to form a directional beam. According to an embodiment, the antenna elements 420 may be disposed on or inside the first surface 412 of the first board 410. According to an embodiment, the plurality of antenna elements 420 may be configured to form a beam pattern in a first direction (e.g., a z-axis direction). In some alternative embodiments, the first board 410 may comprise a single antenna element 420. References in the present disclosure to a plurality of antenna elements may include a single antenna element in alternative embodiments.

According to various embodiments, the first board 410 may be at least partially disposed in a hole, e.g., a through hole 402, provided in at least a portion of the main board 400 (e.g., the printed circuit board 324 in FIG. 3C), as illustrated in FIG. 4B. As used herein, the term "hole" may include a hole or any type of opening in the main board that partially or fully passes through the main board 400 and includes a recess or other type of hole that may not extend fully through the main board 400. The term "hole" may include "groove", cut-out portion", and the like. These terms may be regarded as meaning a certain region within the general plane of the board (or general contour of the board, if the board is not flat) in which the physical substance of the board is absent through the entire board thickness, thereby forming a space. In some examples, such a space may be located within an interior region of the plane of the board, forming a hole (of any suitable shape). In some examples, such a space may be located at an edge region of the board and/or at a corner region of the board (for example such that a part of the outer perimeter of the board has a concave shape at least partially surrounding the space) forming a "cut-out portion". According to an embodiment, when the first board 410 is disposed in the through hole 402 in the main board 400, the first surface 412 of the first board 410 may protrude from a first surface 404 of the main board 400. According to an embodiment, when the first board 410 is disposed in the through hole 402 in the main board 400, the first surface 412 of the first board 410 may be disposed so as to be substantially coplanar with the first surface 404 of the main board 400. According to an embodiment, when the first board 410 is disposed in the through hole 402 in the main board 400, the first surface 412 of the first board 410 may be disposed so as to be lower than the first surface 404 of the main board 400. According to an embodiment, the first board 410 may include a material having a dielectric constant relatively lower than that of the main board 400.

According to various embodiments, when disposed so as to be inserted into the through hole 402 in the main board 400, the first board 410 may be coupled or connected to the wireless communication circuit 430 disposed on the second surface 406 of the main board 400. According to an embodiment, the first board 410 and the wireless communication circuit 430 may be electrically and/or physically coupled to each other through a conductive bonding method. For example, the conductive bonding method may include, for example, and without limitation, soldering, jet soldering, and/or applying an anisotropic conductive film (ACF), or the like.

According to an embodiment, as illustrated in FIG. 4B, the wireless communication circuit 430 may be disposed so as to at least partially overlap the main board 400 when the first surface 404 of the main board 400 is viewed from above (e.g., in the −z-axis direction). According to an embodiment, when the wireless communication circuit 430 is viewed in the z-axis direction, at least a portion of the wireless communication circuit 430 may overlap the main board 400, and at least a part of the remaining portion may overlap the first board 410 disposed in the through hole 402. For example, the wireless communication circuit 430 may be coupled or connected to the main board 400. For example, the wireless communication circuit 430 and the main board 400 may be electrically and/or physically coupled to each other through a conductive bonding method. For example, the wireless communication circuit 430 may include one chipset or package.

According to various embodiments, the wireless communication circuit 430 may transmit and/or receive wireless signals in a predetermined frequency band via the plurality of antenna elements 420 disposed on the first board 410. According to an embodiment, the wireless communication circuit 430 (e.g., the third RFIC 226 in FIG. 2) may be electrically connected to at least one circuit (e.g., a communication processor (CP) 452 and/or a PMIC 454) disposed on the main board 400 via the main board 400. For example, during transmission, the wireless communication circuit 430 may up-convert a baseband signal acquired from the communication processor 452 into an RF signal in a predetermined band. The RF signal may be transmitted to the plurality of antenna elements 420 via the first board 410. During reception, the wireless communication circuit 430 may down-convert an RF signal received through the plurality of antenna elements 420 (e.g., an array antenna) disposed on the first board 410 into a baseband signal, and may transmit the baseband signal to the communication processor 452. As another example, during transmission, the wireless communication circuit 430 may up-convert an IF signal (e.g., about 9 GHz to about 11 GHz) acquired from an intermediate frequency integrated circuit (IFIC) (e.g., the fourth RFIC 228 in FIG. 2) into an RF signal in a predetermined band. During reception, the wireless communication circuit 430 may down-convert the acquired RF signal received via the plurality of antenna elements 420 (e.g., an array antenna) disposed on the first board 410 into an IF signal and may transmit the IF signal to the IFIC.

According to various embodiments, the main board 400 may be disposed in the housing (e.g., the housing 310 in FIG. 3A) of an electronic device (e.g., the electronic device 300 in FIG. 3A). According to an embodiment, at least one circuit may be disposed on one surface (e.g., the first surface 404 and/or the second surface 406) of the main board 400. For example, the communication processor 452 and/or the power management integrate circuit (PMIC) 454 may be disposed on the first surface 404 (or the second surface 406) of the main board 400.

According to an embodiment, the communication processor 452 (e.g., the processor 120 in FIG. 1, or the first communication processor 212 or the second communication processor 214 in FIG. 2) may process a baseband signal. For example, the communication processor 452 may generate a baseband signal and transmit the signal to the wireless communication circuit 430 via the main board 400. For example, the communication processor 452 may process a baseband signal received from the wireless communication circuit 430 via the main board 400. According to an embodiment, the PMIC 454 may receive a voltage from the main board 400 and may provide required power to various components (e.g., the wireless communication circuit 430) on the antenna module.

Figure 4C:
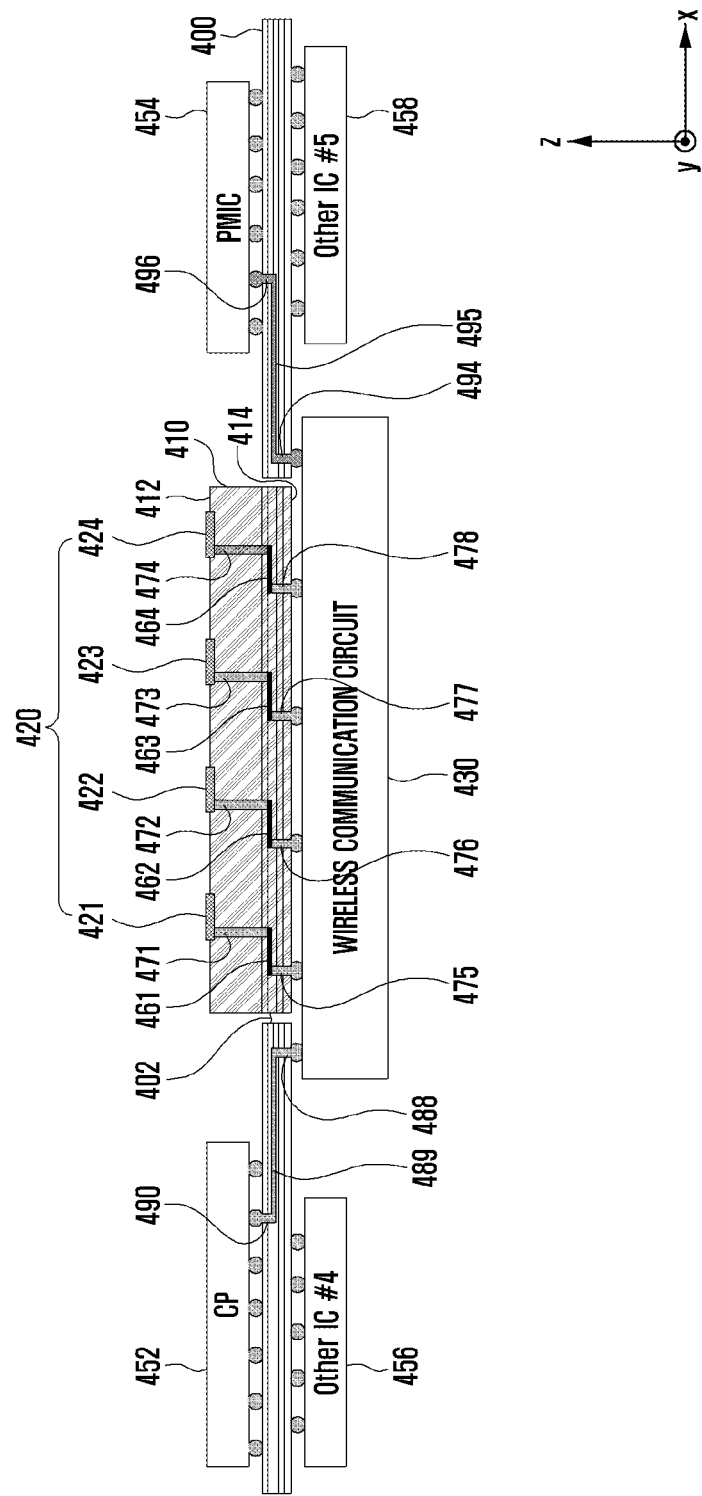
FIG. 4C is a cross-sectional view of the antenna module taken along line A-A in FIG. 4B according to various embodiments.
Figure 4D:
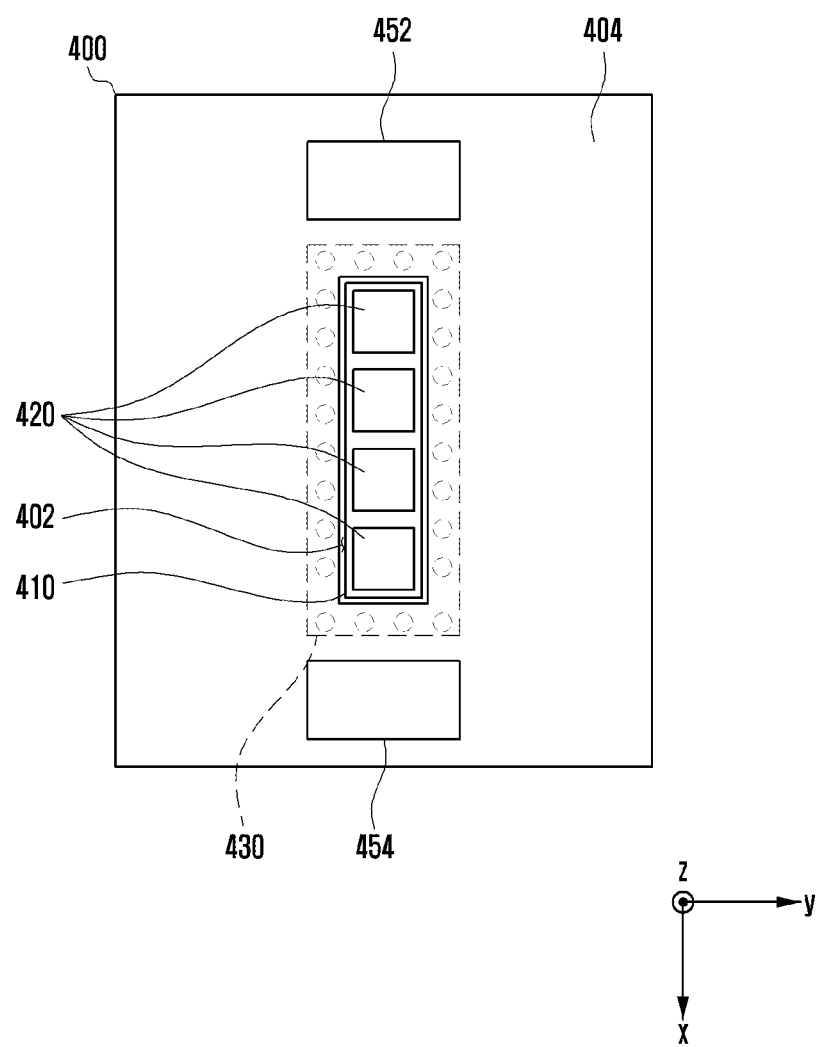
FIG. 4D is a plan view of the antenna module viewed in the −z-axis direction in FIG. 4B according to various embodiments.
Figure 4E:
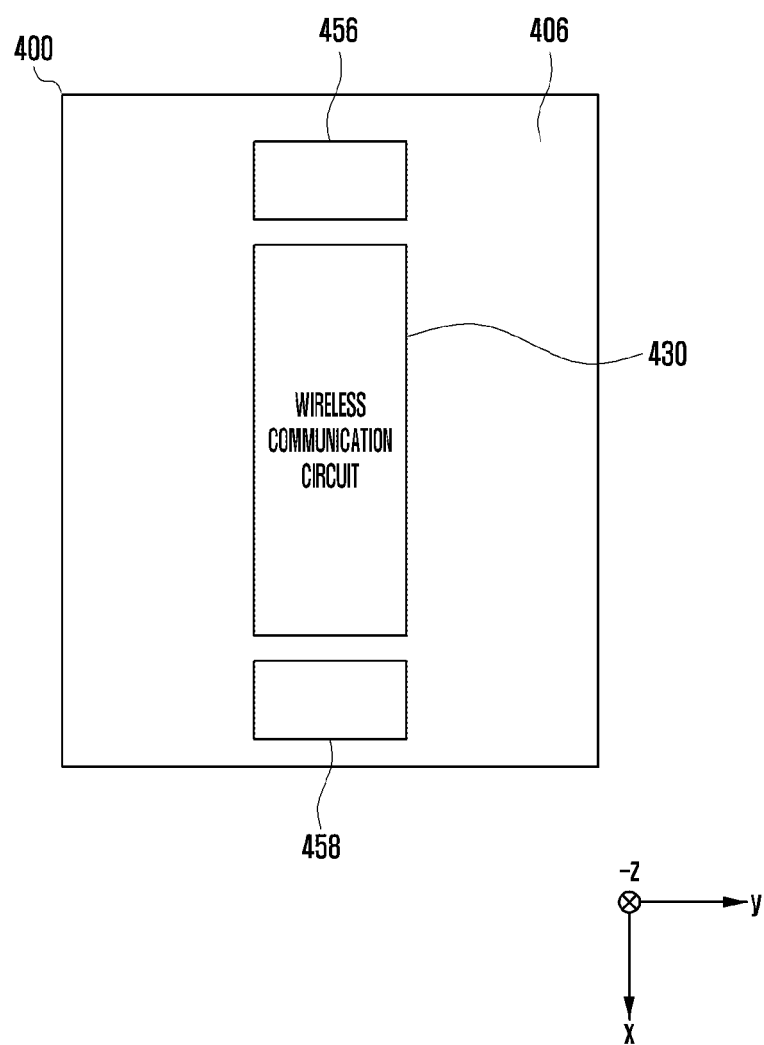
FIG. 4E is a plan view of the antenna module viewed in the z-axis direction in FIG. 4B according to various embodiments.

FIG. 4C is a cross-sectional view of the antenna module taken along line A-A in FIG. 4B according to various embodiments. FIG. 4D is a plan view of the antenna module viewed in the −z-axis direction in FIG. 4B according to various embodiments. FIG. 4E is a plan view of the antenna module embodiments viewed in the z-axis direction in FIG. 4B according to various embodiments.

Referring to FIGS. 4C, 4D, and 4E, according to various embodiments, at least a portion of the first board 410 may be disposed in the through hole 402 provided in at least a portion of the main board 400 and may be coupled or connected to the wireless communication circuit 430. According to an embodiment, when the first surface 404 of the main board 400 is viewed from above (e.g., in the −z-axis direction), the first board 410 may be disposed in the through hole 402 in the main board 400, as illustrated in FIG. 4D. According to an embodiment, when the second surface 406 of the main board 400 is viewed from above (e.g., in the z-axis direction), the wireless communication circuit 430 may be disposed so as to at least partially overlap the main board 400 such that the first board 410 disposed in the through hole 402 in the main board 400 is supported, as illustrated in FIG. 4E.

According to various embodiments, the first board 410 may include a plurality of antenna elements 420 and/or a plurality of matching circuits 461, 462, 463 and 464. For example, the plurality of antenna elements 420 may include a first element 421, a second element 422, a third element 423, and/or a fourth element 424. According to an embodiment, the plurality of matching circuits 461, 462, 463 and 464 may serve to match the impedance of the antenna element 421, 422, 423 and/or 424 electrically connected thereto. For example, the first element 421 may be electrically connected to the first matching circuit 461 via the first via 471. The second element 422 may be electrically connected to the second matching circuit 462 via the second via 472. The third element 423 may be electrically connected to the third matching circuit 463 via the third via 473. The fourth element 424 may be electrically connected to the fourth matching circuit 464 via the fourth via 474. In the present disclosure, a "via" (e.g. when referring to an "nth via" where n is an integer label distinguishing between different vias) may be understood as meaning a component (e.g. a wire or other portion of conductive material) providing a connection (e.g. an electrical connection) between two or more other elements, components, circuits, and the like. Such a connection may be provided through a further element or component. For example, the first via 471 provides an electrical connection between the first element 421 and the first matching circuit 461 through the first board 410.

According to various embodiments, the first board 410 may be electrically and/or physically connected to the wireless communication circuit 430 through a conductive bonding method. According to an embodiment, the first matching circuit 461 of the first board 410 may be electrically connected to the wireless communication circuit 430 via the fifth via 475. According to an embodiment, the second matching circuit 462 of the first board 410 may be electrically connected to the wireless communication circuit 430 via the sixth via 476. According to an embodiment, the third matching circuit 463 of the first board 410 may be electrically connected to the wireless communication circuit 430 via the seventh via 477. According to an embodiment, the fourth matching circuit 464 of the first board 410 may be electrically connected to the wireless communication circuit 430 via the eighth via 478.

According to various embodiments, the wireless communication circuit 430 may be electrically connected to at least one circuit (e.g., the communication processor 452 and/or the PMIC 454) disposed on the main board 400. According to an embodiment, the wireless communication circuit 430 may be electrically connected to a second electrical wiring line 489 of the main board 400 via a fifteenth via 488 of the main board 400. The second electrical wiring line 489 of the main board 400 may be electrically connected to the communication processor 452 via a sixteenth via 490. For example, the wireless communication circuit 430 may transmit and/or receive a signal (e.g., a control signal, a baseband signal, or an IF signal) to/from the communication processor 452 electrically connected thereto via the main board 400.

According to an embodiment, the wireless communication circuit 430 may be electrically connected to a fourth electrical wiring line 495 of the main board 400 via a nineteenth via 494 of the main board 400. The fourth electrical wiring line 495 of the main board 400 may be electrically connected to the PMIC 454 via a twentieth via 496. For example, the wireless communication circuit 430 may receive a power signal from the PMIC 454 electrically connected thereto via the main board 400.

According to various embodiments, the main board 400 may include at least one circuit. According to an embodiment, the communication processor (CP) 452 and/or the PMIC 454 may be disposed on the first surface 404 of the main board 400. According to an embodiment, one or more other circuits 456 and/or 458 may be disposed on the second surface 406 of the main board 400. According to an embodiment, the main board 400 may further include a shield member (e.g., a shield, not illustrated). For example, the shield member may be disposed on a portion of the main board 400 so as to electromagnetically shield one or more circuits 452, 454, 456, and/or 458 disposed on the main board 400. For example, the shield member may include a shield can.

According to various embodiments, the first board 410 may be electrically connected to the wireless communication circuit 430 via the main board 400. According to an embodiment, the first board 410 and the main board 400 may be electrically and/or physically coupled to each other through a conductive bonding method. The first board 410 may be electrically connected to the wireless communication circuit 430 via the main board 400 electrically and/or physically coupled thereto through a conductive bonding method.

Figure 4F:
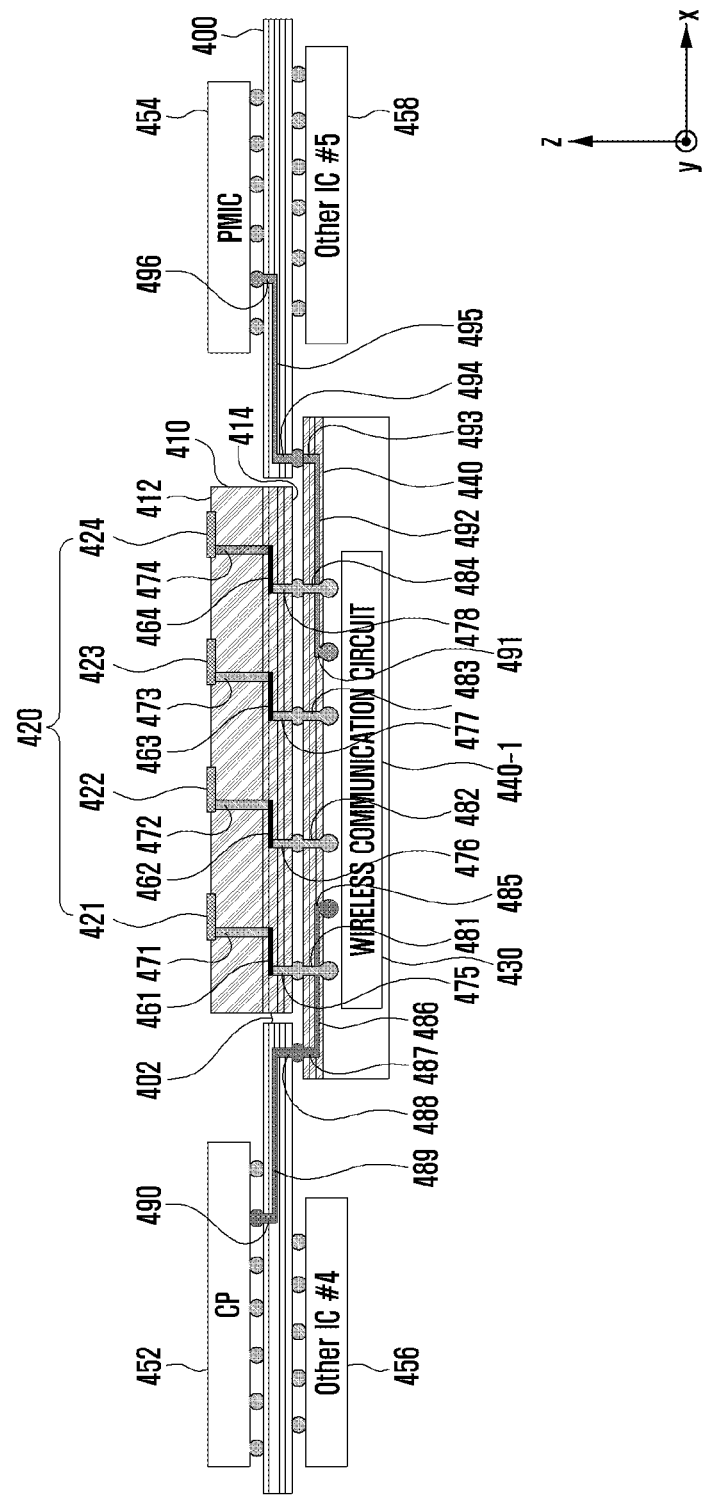
FIG. 4F is a cross-sectional view illustrating an example wireless communication circuit disposed in an antenna module according to various embodiments.

FIG. 4F is a cross-sectional view illustrating an example wireless communication circuit disposed in an antenna module according to various embodiments.

Referring to FIG. 4F, according to various embodiments, at least a portion of the first board 410 may be disposed in the through hole 402 provided in at least a portion of the main board 400 and may be coupled or connected to a second board 440. According to an embodiment, when the second surface 406 of the main board 400 is viewed from above (e.g., in the z-axis direction), the second board 440 may be disposed so as to at least partially overlap the main board 400 disposed in the through hole 402 in the main board 400 such that the first board 410 disposed in the through hole 402 in the main board 400 is supported. A detailed description of the first board 410 of FIG. 4F will not be repeated here to avoid redundancy with that made with reference to FIG. 4C.

According to various embodiments, the first board 410 may be electrically and/or physically connected to the second board 440 through a conductive bonding method (e.g., soldering). According to an embodiment, the first matching circuit 461 of the first board 410 may be electrically connected to the wireless communication circuit 430 via the fifth via 475 and the ninth via 481 of the second board 440. For example, the fifth via 475 and the ninth via 481 may be electrically and/or physically connected to each other through a conductive bonding method (e.g., soldering). According to an embodiment, the second matching circuit 462 of the first board 410 may be electrically connected to the wireless communication circuit 430 via the sixth via 476 and the tenth via 482 of the second board 440. For example, the sixth via 476 and the tenth via 482 may be electrically and/or physically connected to each other through a conductive bonding method (e.g., soldering). According to an embodiment, the third matching circuit 463 of the first board 410 may be electrically connected to the wireless communication circuit 430 via the seventh via 477 and the eleventh via 483 of the second board 440. For example, the seventh via 477 and the eleventh via 483 may be electrically and/or physically connected to each other through a conductive bonding method (e.g., soldering). According to an embodiment, the fourth matching circuit 464 of the first board 410 may be electrically connected to the wireless communication circuit 430 via the eighth via 478 and the twelfth via 484 of the second board 440. For example, the eighth via 478 and the twelfth via 484 may be electrically and/or physically connected to each other through a conductive bonding method (e.g., soldering).

According to various embodiments, the wireless communication circuit 430 may be disposed on one surface of the second board 440. According to an embodiment, the wireless communication circuit 430 may, for example, be fixed on the one surface of the second board 440 by a protective layer 440-1 (e.g., resin).

According to various embodiments, the wireless communication circuit 430 may be electrically connected to at least one circuit (e.g., the communication processor 452 and/or the PMIC 454) disposed on the main board 400 via the second board 440 and the main board 400. According to an embodiment, the wireless communication circuit 430 may be electrically connected to a first electrical wiring line 486 of the second board 440 via a thirteenth via 485. The first electrical wiring line 486 of the second board 440 may be electrically connected to the second electrical wiring line 489 of the main board 400 via the fourteenth via 487 and the fifteenth via 488 of the main board 400. The second electrical wiring line 489 of the main board 400 may be electrically connected to the communication processor 452 via the sixteenth via 490. For example, the fourteenth via 487 and the fifteenth via 488 may be electrically and/or physically connected to each other through a conductive bonding method (e.g., soldering). For example, the wireless communication circuit 430 may transmit and/or receive a signal (e.g., a control signal, a baseband signal, or an IF signal) to/from the communication processor 452 electrically connected via the second board 440 and the main board 400.

According to an embodiment, the wireless communication circuit 430 may be electrically connected to a third electrical wiring line 492 of the second board 440 via a seventeenth via 491. The third electrical wiring line 492 of the second board 440 may be electrically connected to the fourth electrical wiring 495 of the main board 400 via the eighteenth via 493 and the nineteenth via 494 of the main board 400. The fourth electrical wiring line 495 of the main board 400 may be electrically connected to the PMIC 454 via the twentieth via 496. For example, the eighteenth via 493 and the nineteenth via 494 may be electrically and/or physically connected to each other through a conductive bonding method (e.g., soldering). For example, the wireless communication circuit 430 may receive a power signal from the PMIC 454 electrically connected thereto via the second board 440 and the main board 400.

According to various embodiments, at least one circuit 452, 454, 456, and/or 458 disposed on the main board 400 may be disposed on the main board 400 via a separate board (not illustrated) like the wireless communication circuit 430.

According to various embodiments, in the electronic device, by disposing the first board 410 including the plurality of antenna elements 420 (e.g., an array antenna) in the through hole 402 in the main board 400, it is possible to reduce the space (e.g., the height) required by the antenna module.

Figure 5A:
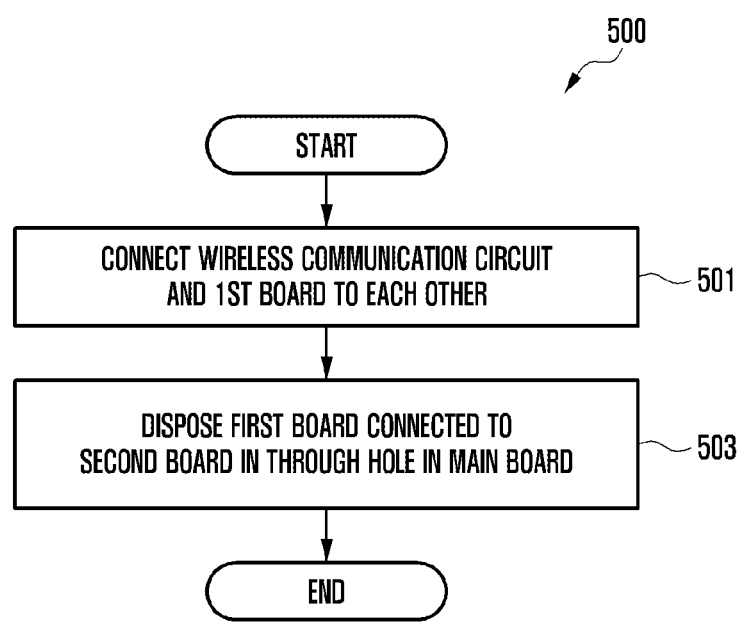
FIG. 5A is a flowchart illustrating example steps of manufacturing an antenna module according to various embodiments.
Figure 5B:
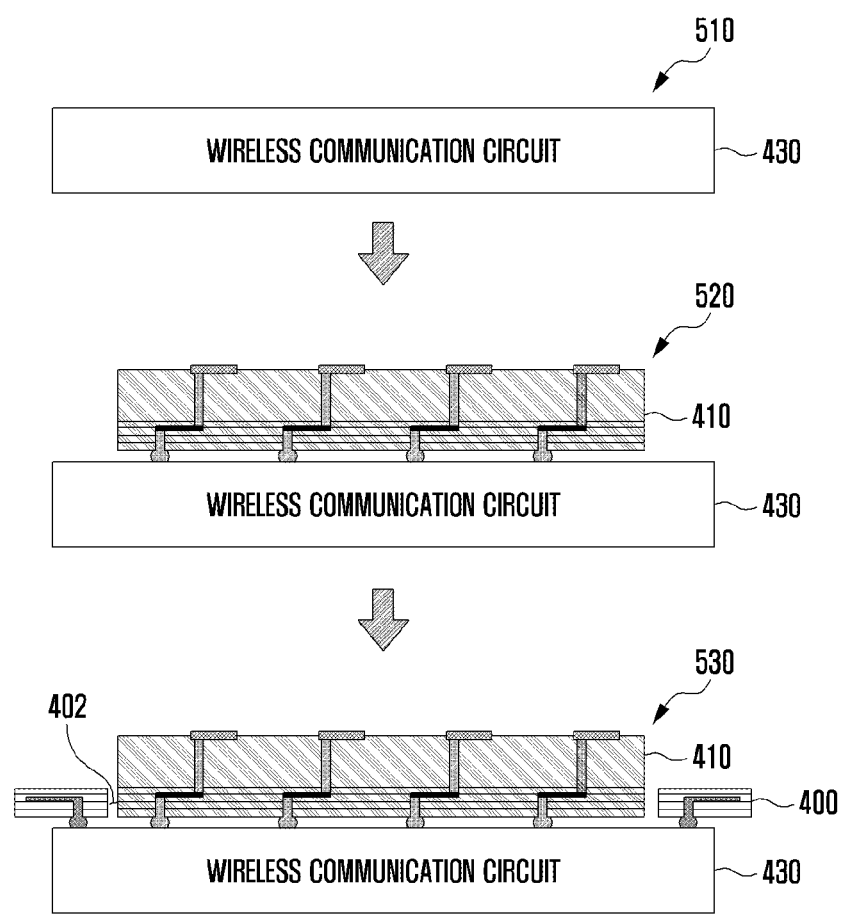
FIG. 5B is a diagram illustrating example steps of manufacturing an antenna module illustrated in FIG. 5A according to various embodiments.

FIG. 5A is a flowchart 500 illustrating example steps of manufacturing an antenna module according to various embodiments. FIG. 5B is a diagram illustrating example steps of manufacturing an antenna module illustrated in FIG. 5A according to various embodiments.

Referring to FIGS. 5A and 5B, according to various embodiments, in operation 501, the first board 410 may be connected to a surface (e.g., the first surface 432) of the wireless communication circuit 430. According to an embodiment, the first board 410 may be electrically and/or physically coupled to the first surface 432 of the wireless communication circuitry 430 (510 and 520). For example, the first board 410 may include a plurality of antenna elements 420 and/or a plurality of matching circuits 461, 462, 463 and 464 disposed inside or on the first surface 412 of the first board 410 so as to form a directional beam. For example, the first board 410 may include a ground disposed inside or on the second surface 414. According to an embodiment, the plurality of antenna elements 420 disposed on the first board 410 may be electrically connected to the wireless communication circuit 430 via the first board 410.

In operation 503, at least a portion of the first board 410 disposed on a surface (e.g., the first surface 432) of the wireless communication circuit 430 may be disposed inside the through hole 402 in the main board 400. According to an embodiment, the wireless communication circuit 430 may be coupled so as to at least partially overlap the main board 400. For example, the wireless communication circuit 430 and the main board 400 may be electrically and/or physically coupled to each other through a conductive bonding method (e.g., soldering) in partial overlapping regions (530). According to an embodiment, the wireless communication circuit 430 may be electrically connected to at least one circuit (e.g., the communication processor 452 and/or the PMIC 454) disposed on the main board 400.

According to various embodiments, the order of the operations for manufacturing the antenna module represented in FIG. 5A may be at least partially changed, or some operations may be omitted. According to an embodiment, the wireless communication circuit 430 may be coupled so as to at least partially overlap the main board 400. The first board 410 may be disposed inside the through hole in the main board 400 coupled to the wireless communication circuit 430 so as to at least partially overlap the same.

Figure 6:
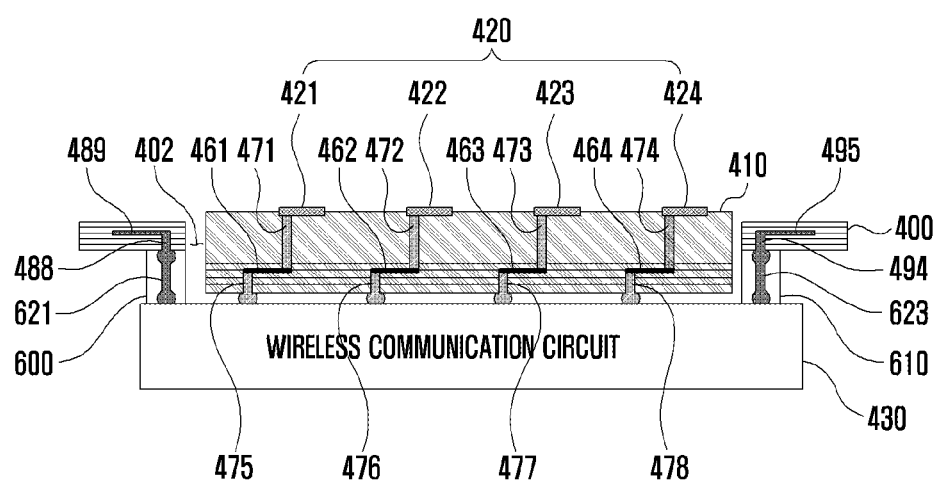
FIG. 6 is a cross-sectional view illustrating an example structure of an antenna module using an interposer according to various embodiments.

FIG. 6 is a cross-sectional view illustrating an example structure of an antenna module using an interposer according to various embodiments. According to an embodiment, the antenna module of FIG. 6 may be at least partially similar to the third antenna module 246 of FIG. 2, or may include various embodiments of the antenna module.

According to various embodiments to be described with reference to FIG. 6, the antenna module may include a first board 410 including a plurality of antenna elements 420 and a wireless communication circuit 430 electrically connected to the first board 410. For example, the plurality of antenna elements 420 may include a first element 421, a second element 422, a third element 423, or a fourth element 424. A detailed description of the first board 410 and the wireless communication circuit 430 of FIG. 6 will not be repeated here to avoid redundancy with that made with reference to FIGS. 4A, 4B, 4C and/or 4F.

According to various embodiments, the wireless communication circuit 430 may be electrically connected to at least one circuit (e.g., the communication processor 452 and/or the PMIC 454) disposed on the main board 400 via interposers 600 and/or 610 and the main board 400. According to an embodiment, the wireless communication circuit 430 may be electrically connected to the second electrical wiring line 489 of the main board 400 via a twenty-first via 621 of a first interposer 600 and the fifteenth via 488 of the main board 400. For example, the twenty-first via 621 and the fifteenth via 488 may be electrically and/or physically connected to each other through a conductive bonding method (e.g., soldering). For example, the wireless communication circuit 430 may transmit and/or receive a signal (e.g., a control signal, a baseband signal, or an IF signal) to/from the communication processor 452 electrically connected thereto.

According to an embodiment, the wireless communication circuit 430 may be electrically connected to the fourth electrical wiring line 495 of the main board 400 via a twenty-second via 623 of a second interposer 610 and the nineteenth via 494 of the main board 400. For example, the twenty-second via 623 and the nineteenth via 494 may be electrically and/or physically connected to each other through a conductive bonding method (e.g., soldering). For example, the wireless communication circuit 430 may receive a power signal from the PMIC 454 electrically connected thereto.

According to various embodiments, in the electronic device, by electrically and/or physically connecting the main board 400 and the wireless communication circuit 430 to each other via the interposers 600 and 610 and disposing the first board 410 including the plurality of antenna elements 420 (e.g., an array antenna) relatively more deeply in the through hole 402 in the main board 400, it is possible to reduce the space (e.g., the height) required by the antenna module.

Figure 7A:
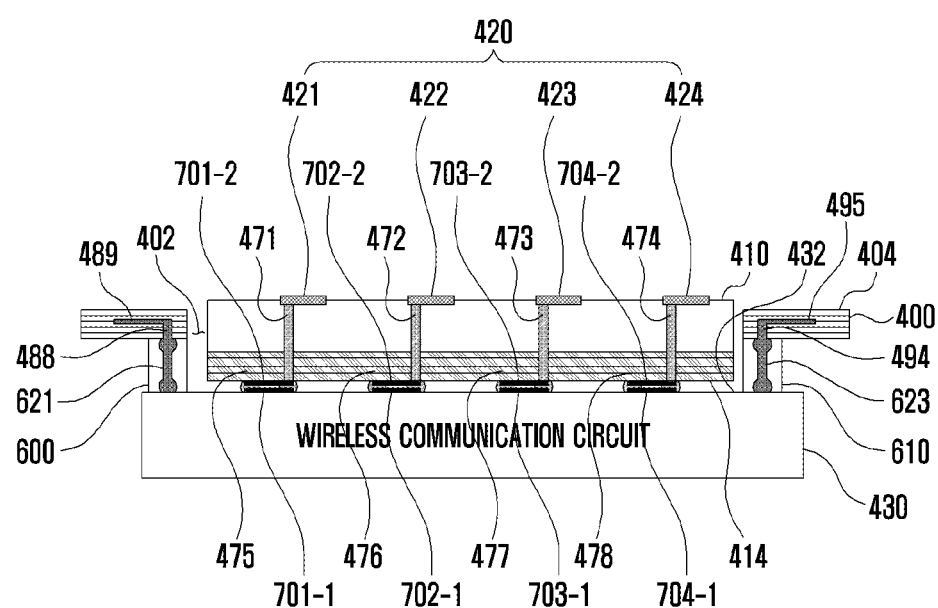
FIGS. 7A, 7B, and 7C are views each illustrating an example matching circuit according to various embodiments.
Figure 7B:
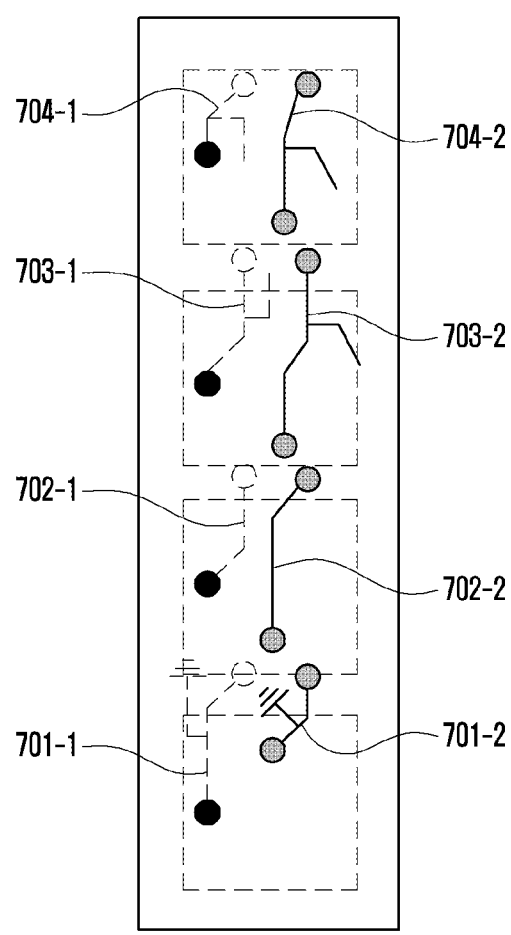
Figure 7C:
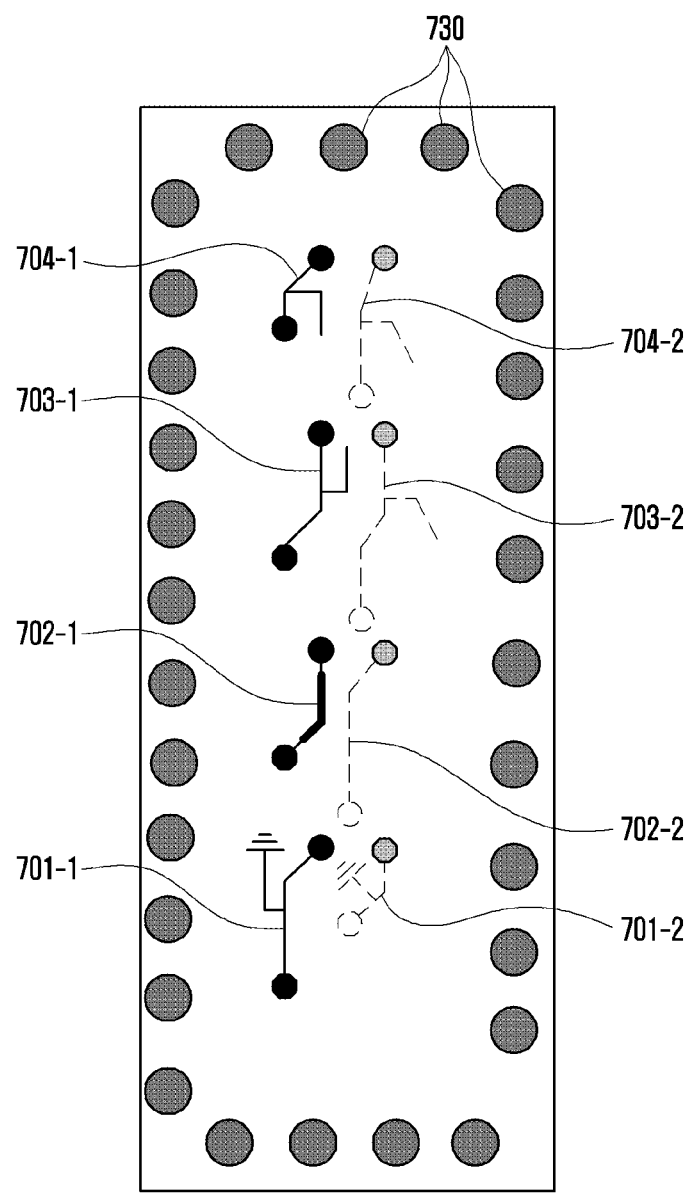

FIGS. 7A, 7B, and 7C are various views and diagrams each illustrating an example matching circuit according to various embodiments. FIG. 7B is a plan view of the second surface 414 of the first board 410 according to various embodiments. FIG. 7C is a plan view of the first surface 432 of the wireless communication circuitry 430 according to various embodiments.

According to an embodiment, the antenna modules of FIGS. 7A, 7B, and 7C may be at least partially similar to the third antenna module 246 of FIG. 2, or may include various embodiments of the antenna module.

Referring to FIGS. 7A, 7B, and 7C, according to various embodiments, a plurality of matching circuits 701-1, 701-2, 702-1, 702-2, 703-1, 703-2, 704-1, and 704-2 may be disposed in a bonding region between the first board 410 and the wireless communication circuit 430. According to an embodiment, at least some of the plurality of matching circuits 701-1, 701-2, 702-1, 702-2, 703-1, 703-2, 704-1 and 704-2 may be disposed on the first surface 432 of the wireless communication circuit 430. At least some of remaining ones of the plurality of matching circuits 701-1, 701-2, 702-1, 702-2, 703-1, 703-2, 704-1 and 704-2 may be disposed on the second surface 414 of the first board 410.

According to an embodiment, among the plurality of matching circuits 701-1, 701-2, 702-1, 702-2, 703-1, 703-2, 704-1, and 704-2, a first matching circuit 701-1, a third matching circuit 702-1, a fifth matching circuit 703-1, and a seventh matching circuit 704-1 related to first polarization (e.g., horizontal polarization) may be disposed on the first surface 432 of the wireless communication circuit 430, as illustrated in FIG. 7C. For example, the first matching circuit 701-1 may be electrically connected to the first element 421 disposed on the first board 410 via the first via 471 of the first board 410. The first matching circuit 701 may be electrically connected to the wireless communication circuit 430. For example, the third matching circuit 702-1 may be electrically connected to the second element 422 disposed on the first board 410 via the second via 472 of the first board 410. The third matching circuit 702-1 may be electrically connected to the wireless communication circuit 430. For example, the fifth matching circuit 703-1 may be electrically connected to the third element 423 disposed on the first board 410 via the third via 473 of the first board 410. The fifth matching circuit 703-1 may be electrically connected to the wireless communication circuit 430. For example, the seventh matching circuit 704-1 may be electrically connected to the fourth element 424 disposed on the first board 410 via the fourth via 474 of the first board 410. The seventh matching circuit 704-1 may be electrically connected to the wireless communication circuit 430.

According to an embodiment, among the plurality of matching circuits 701-1, 701-2, 702-1, 702-2, 703-1, 703-2, 704-1, and 704-2, a second matching circuit 701-2, a fourth matching circuit 702-2, a sixth matching circuit 703-2, and an eighth matching circuit 704-2 related to second polarization (e.g., vertical polarization) may be disposed on the second surface 414 of the first board 410, as illustrated in FIG. 7B. For example, the second matching circuit 701-2 may be electrically connected to the first element 421 via a via (not illustrated) of the first board 410. The second matching circuit 701-2 may be electrically connected to the wireless communication circuit 430. For example, the fourth matching circuit 702-2 may be electrically connected to the second element 422 a via (not illustrated) of the first board 410. The fourth matching circuit 702-2 may be electrically connected to the wireless communication circuit 430. For example, the sixth matching circuit 703-2 may be electrically connected to the third element 423 via a via (not illustrated) of the first board 410. The sixth matching circuit 703-2 may be electrically connected to the wireless communication circuit 430. For example, the eighth matching circuit 704-2 may be electrically connected to the fourth element 424 via a via (not illustrated) of the first board 410. The eighth matching circuit 704-2 may be electrically connected to the wireless communication circuit 430. For example, each of the plurality of matching circuits 701-1, 701-2, 702-1, 702-2, 703-1, 703-2, 704-1 and 704-2 may include a port for electrical connection with a via.

According to an embodiment, when the first surface 404 of the main board 400 is viewed from above (e.g., in the −z-axis direction), the first matching circuit 701-1, the third matching circuit 702-1, the fifth matching circuit 703-1, and the seventh matching circuit 704-1 disposed on the first surface 432 of the wireless communication circuit 430 and the second matching circuit 701-2, the fourth matching circuit 702-2, and the sixth matching circuit 703-2, and the eighth matching circuit 704-2 disposed on the second surface 414 of the first board 410 may be disposed so as not to overlap each other, as illustrated in FIGS. 7B and 7C.

According to an embodiment, the plurality of matching circuits 701-1, 701-2, 702-1, 702-2, 703-1, 703-2, 704-1, and 704-2 may be implemented on the first board 410 and/or the wireless communication circuit 430 in the form of a conductive pattern. According to an embodiment, the plurality of matching circuits 701-1, 701-2, 702-1, 702-2, 703-1, 703-2, 704-1, and 704-2 may include passive elements disposed on one surface of the first board 410 and/or one surface of the wireless communication circuit 430.

According to an embodiment, the plurality of matching circuits 701-1, 701-2, 702-1, 702-2, 703-1, 703-2, 704-1 and 704-2 may be disposed on the second surface 414 of the first board 410 or the first surface 432 of the wireless communication circuit 430.

According to an embodiment, the wireless communication circuit 430 may include a plurality of conductive pads 730 for the interposer 600 and/or the interposer 610. For example, at least some of the plurality of conductive pads 730 may be connected to a ground layer via respective vias so as to electromagnetically shield the plurality of matching circuits 701-1, 701-2, 702-1, 702-2, 703-1, 703-2, 704-1, and 704-2. For example, at least some of the plurality of conductive pads 730 may be used as paths for electrical connection with the main board 400. For example, at least some of the plurality of conductive pads 730 may be used as conductive bonding pads for conductive bonding (e.g., soldering) with the interposer 600 and/or interposer 610.

According to various embodiments, in the antenna module, by disposing the plurality of matching circuits 701-1, 701-2, 702-1, 702-2, 703-1, 703-2, 704-1, and 704-2 for a plurality of antenna elements 420 in the bonding region between the first board 410 and the wireless communication circuit 430, it is possible to exclude a ground layer related to electrical wiring of the antenna elements 420 and the wireless communication circuit 430 from the inside of the first board 410, which makes it possible to relatively reduce the height of the first board 410.

Figure 8A:
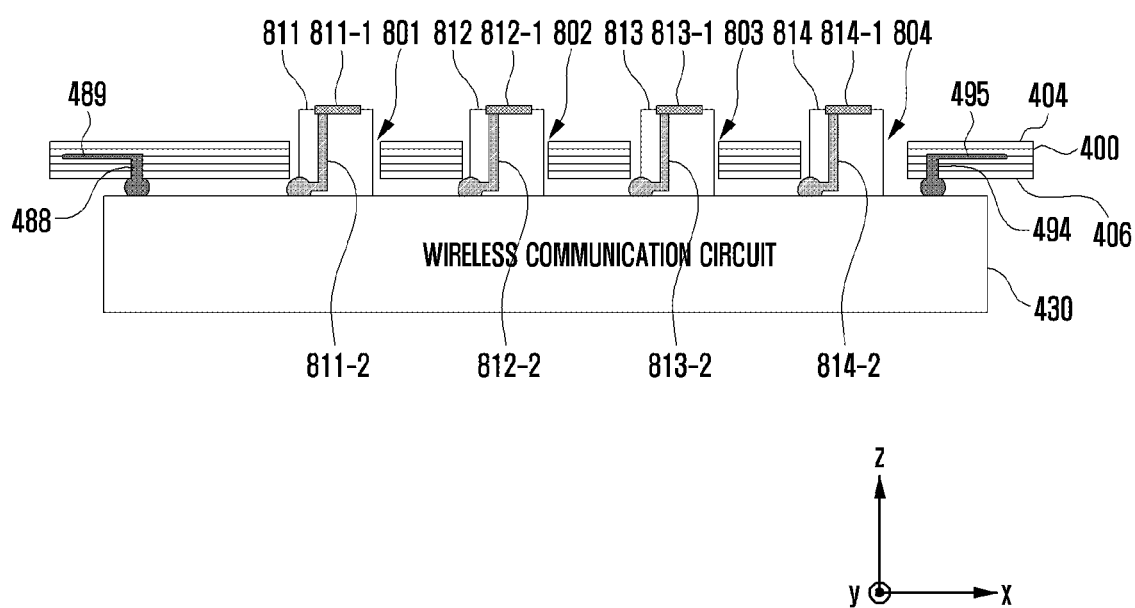
FIGS. 8A and 8B are cross-sectional views each illustrating an example structure disposed in each through hole in a main board for each antenna element according to various embodiments.
Figure 8B:
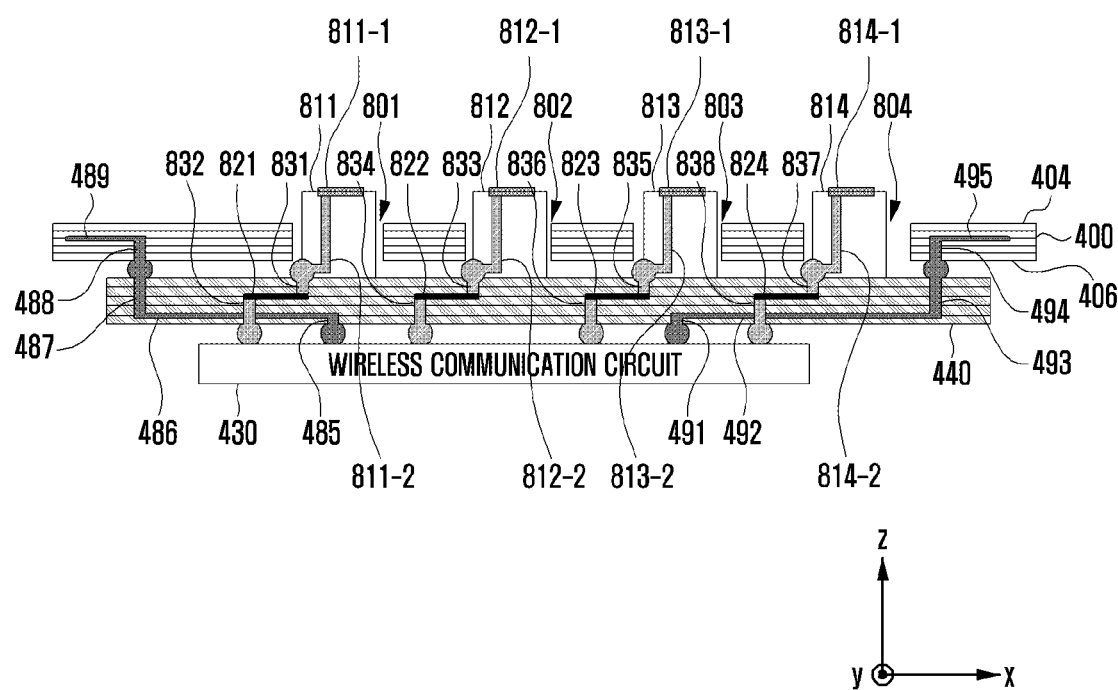

FIGS. 8A and 8B are cross-sectional views each illustrating an example structure disposed in each through hole in a main board for each antenna element according to various embodiments. According to an embodiment, the antenna modules of FIGS. 8A and 8B may be at least partially similar to the third antenna module 246 of FIG. 2, or may include various embodiments of the antenna module. In the following description, a detailed description of the wireless communication circuits 430 of FIGS. 8A and 8B may not be repeated to avoid redundancy with that made with reference to FIGS. 4A, 4B, 4C, and/or 4F.

According to various embodiments with reference to FIGS. 8A and 8B, a plurality of antenna structures 811, 812, 813, and 814 of an array antenna may be disposed in the manner of being respectively inserted into different through-holes 801, 802, 803 and 804 provided in the main board 400. For example, the first board (e.g., the first board 410) may be omitted. According to an embodiment, a first antenna 811 may be disposed in a first through hole 801 in the main board 400. A second antenna structure 812 may be disposed in a second through hole 802 in the main board 400. A third antenna structure 813 may be disposed in a third through hole 803 in the main board 400. A fourth antenna structure 814 may be disposed in a fourth through hole 804 in the main board 400.

According to various embodiments, when disposed so as to be inserted into different through holes 801, 802, 803, and 804 in the main board 400, the plurality of antenna structures 811, 812, 813, and 814 may be coupled or connected to the wireless communication circuit 430 disposed on the second surface 406 of the main board 400, as illustrated in FIG. 8A.

According to an embodiment, the plurality of antenna structures 811, 812, 813, and 814 may include a plurality of antenna elements 811-1, 812-1, 813-1 and 814-1, respectively. For example, the first antenna element 811-1 may be disposed on one surface of the first antenna structure 811 or inside the first antenna structure 811. For example, the second antenna element 812-1 may be disposed on one surface of the second antenna structure 812 or inside the second antenna structure 812. For example, the third antenna element 813-1 may be disposed on one surface of the third antenna structure 813 or inside the third antenna structure 813. For example, the fourth antenna element 814-1 may be disposed on one surface of the fourth antenna structure 814 or inside the fourth antenna structure 814.

According to an embodiment, the first element 811-1 included in the first antenna structure 811 may be electrically connected to the wireless communication circuit 430 via a forty-eighth via 811-2 of the first antenna structure 811.

According to an embodiment, the second element 812-1 included in the second antenna structure 812 may be electrically connected to the wireless communication circuit 430 via a forty-ninth via 812-2 of the second antenna structure 812.

According to an embodiment, the third element 813-1 included in the third antenna structure 813 may be electrically connected to the wireless communication circuit 430 via a fiftieth via 813-2 of the third antenna structure 813.

According to an embodiment, the fourth element 814-1 included in the fourth antenna structure 814 may be electrically connected to the wireless communication circuit 430 via a fifty-first via 814-2 of the fourth antenna structure 814.

According to various embodiments, when disposed so as to be inserted into different through holes 801, 802, 803, and 804 in the main board 400, the plurality of antenna structures 811, 812, 813, and 814 may be coupled or connected to the second board 440 disposed on the second surface 406 of the main board 400, as illustrated in FIG. 8B.

According to an embodiment, the first element 811-1 included in the first antenna structure 811 may be electrically connected to the first matching circuit 821 of the second board 440 via a forty-eighth via 811-2 of the first antenna structure 811 and a twenty-third via 831 of the second board 440. The first matching circuit 821 may be electrically connected to the wireless communication circuit 430 via a twenty-fourth via 832. For example, the forty-eighth via 811-2 and the twenty-third via 831 may be electrically and/or physically connected to each other through a conductive bonding method (e.g., soldering).

According to an embodiment, the second element 812-1 included in the second antenna structure 812 may be electrically connected to the second matching circuit 822 of the second board 440 via a forty-ninth via 812-2 of the second antenna structure 812 and a twenty-fifth via 833 of the second board 440. The second matching circuit 822 may be electrically connected to the wireless communication circuit 430 via a twenty-sixth via 834. For example, the forty-ninth via 812-2 and the twenty-fifth via 833 may be electrically and/or physically connected to each other through a conductive bonding method (e.g., soldering).

According to an embodiment, the third element 813-1 included in the third antenna structure 813 may be electrically connected to the third matching circuit 823 of the second board 440 via a fiftieth via 813-2 of the third antenna structure 813 and a twenty-seventh via 835 of the second board 440. The third matching circuit 823 may be electrically connected to the wireless communication circuit 430 via a twenty-eighth via 836. For example, the fiftieth via 813-2 and the twenty-seventh via 835 may be electrically and/or physically connected to each other through a conductive bonding method (e.g., soldering).

According to an embodiment, the fourth element 814-1 included in the fourth antenna structure 814 may be electrically connected to the fourth matching circuit 824 of the second board 440 via a fifty-first via 814-2 of the fourth antenna structure 814 and a twenty-ninth via 837 of the second board 440. The fourth matching circuit 824 may be electrically connected to the wireless communication circuit 430 via a thirtieth via 838. For example, the fifty-first via 814-2 and the twenty-ninth via 837 may be electrically and/or physically connected to each other through a conductive bonding method (e.g., soldering).

According to various example embodiments, an electronic device (e.g., the electronic device 101 in FIG. 1 or FIG. 2 or the electronic device 300 in FIGS. 3A to 3C) includes: a housing (e.g., the housing 310 in FIG. 3A); a main board (e.g., the main board 400 in FIG. 4A, FIG. 6, FIG. 7A, FIG. 8A, or FIG. 8B) disposed in an internal space of the housing and including a first surface (e.g., the first surface 404 in FIG. 4A, FIG. 6, FIG. 7A, FIG. 8A, or FIG. 8B) oriented in a first direction, a second surface (e.g., the second surface 406 in FIG. 4A, FIG. 6, FIG. 7A, FIG. 8A, or FIG. 8B) facing a second direction opposite the first direction, and a hole or opening (e.g., the through hole 402 in FIG. 4A, FIG. 6, FIG. 7A, FIG. 8A, or FIG. 8B); and an antenna module disposed in the main board. The antenna module includes: a board (e.g., the first board 410 in FIG. 4A, FIG. 6, FIG. 8A, or FIG. 8B) at least partially disposed in the hole and including a plurality of antenna elements (e.g., the antenna elements 420 in FIG. 4A, FIG. 6, FIG. 8A, or FIG. 8B); and a wireless communication circuit (e.g., the wireless communication circuit 430 in FIG. 4A, FIG. 6, FIG. 7A, FIG. 8A, or FIG. 8B) configured to transmit and/or receive a wireless signal in a predetermined frequency band via the plurality of antenna elements the wireless communication circuit disposed on the second surface of the main board.

According to various example embodiments, the board may protrude from the first surface of the main board.

According to various example embodiments, the board may be substantially coplanar with or lower than the first surface of the main board.

According to various example embodiments, the wireless communication circuit may be disposed to at least partially overlap the main board when the first surface of the main board is viewed from above.

According to various example embodiments, the board and the wireless communication circuit may be electrically and/or physically coupled to each other through a conductive bonding method.

According to various example embodiments, the wireless communication circuit may be coupled or connected to the main board, and the board may be coupled or connected to the wireless communication circuit.

According to various example embodiments, the wireless communication circuit may be coupled or connected to the main board through a conductive bonding method.

According to various example embodiments, the main board may include at least one circuit, and the wireless communication circuit may be electrically connected to the at least one circuit via the main board.

According to various example embodiments, the at least one circuit may include a communication processor and/or a power management circuit.

According to various example embodiments, the electronic device may further include an interposer (e.g., the interposers 600 and 610 in FIG. 6) disposed between the main board and the wireless communication circuit, and the wireless communication circuit may be electrically connected to the main board via the interposer.

According to various example embodiments, the electronic device may further include at least one matching circuit (e.g., the matching circuits 461, 462, 463 and/or 464 in FIG. 4A or FIG. 6) disposed between the board and the wireless communication circuit and electrically connected to the plurality of antenna elements.

According to various example embodiments, the matching circuit may include one or more conductive patterns disposed on the board and/or the wireless communication circuit.

According to various example embodiments, the one or more conductive patterns disposed on the board and/or the wireless communication circuit may be disposed to not overlap each other when the first surface of the main board is viewed from above.

According to various example embodiments, the board may include a material having a dielectric constant lower than that of the main board.

According to various example embodiments, the antenna module may include: another board (e.g., the third board 1100 in FIG. 11A or FIG. 11B) including a plurality of other antenna elements disposed at a predetermined interval and electrically connected to the wireless communication circuit; and an interposer (e.g., the interposers 1101 and 1102 in FIG. 11B) disposed between the wireless communication circuit and the another board, and the wireless communication circuit may be disposed between the board and the another board and electrically connected to the plurality of other antenna elements via the interposer and the another board.

Figure 9A:
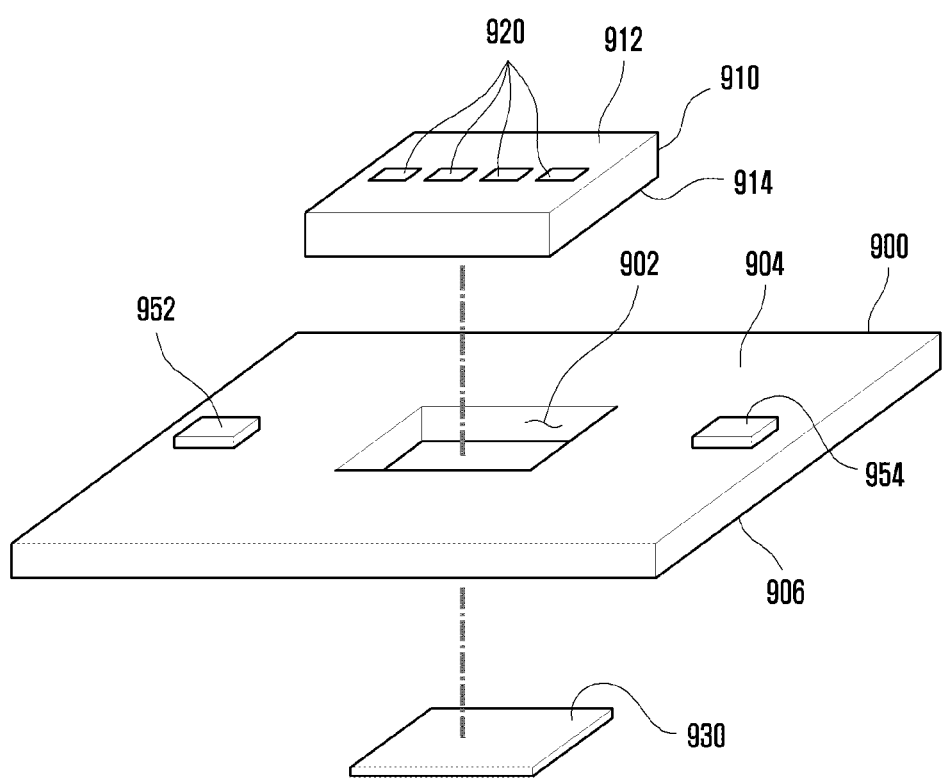
FIGS. 9A and 9B are views illustrating an example structure of an antenna module according to various embodiments.
Figure 9A:
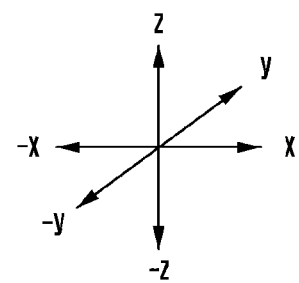
Figure 9B:
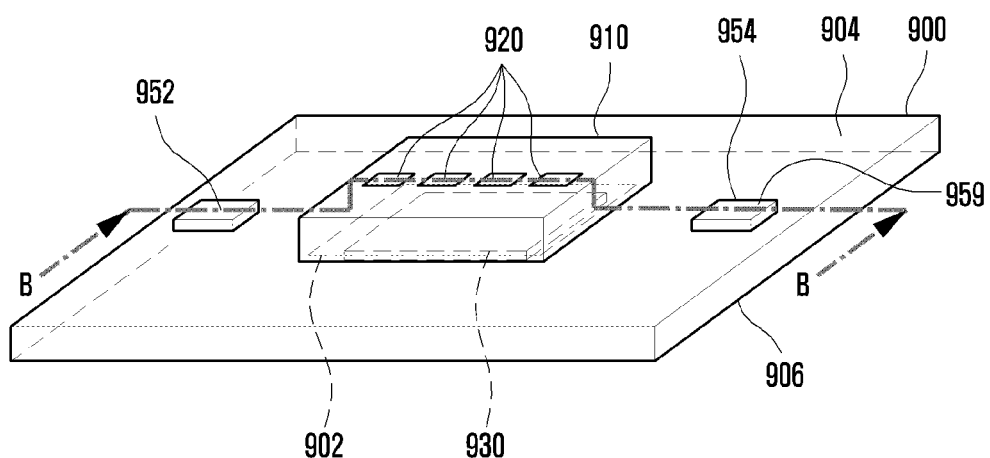
Figure 9B:
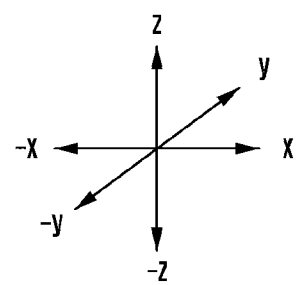

FIGS. 9A and 9B are diagrams illustrating an example structure of an antenna module according to various embodiments. According to an embodiment, the antenna modules of FIGS. 9A and 9B may be at least partially similar to the third antenna module 246 of FIG. 2, or may include various embodiments of the antenna module.

According to various embodiments to be described with reference to FIGS. 9A and 9B, the antenna module may include a first board 910 including a plurality of antenna elements 920 and a wireless communication circuit 930 electrically connected to the first board 910.

According to various embodiments, the first board 910 may include a plurality of conductive layers and a plurality of non-conductive layers alternately stacked with the conductive layers. The first board 910 may provide an electrical connection between various electronic components disposed on the first board 910 and/or outside the first board 410 using wiring lines and conductive vias provided in the conductive layers.

According to various embodiments, the first board 910 may include a plurality of antenna elements 920 arranged at predetermined intervals to form a directional beam. According to an embodiment, the antenna elements 920 may be disposed on or inside the first surface 912 of the first board 910. According to an embodiment, the plurality of antenna elements 920 may be configured to form a beam pattern in a first direction (e.g., a z-axis direction).

According to various embodiments, as illustrated in FIG. 9B, the first board 910 may be disposed so as to at least partially overlap the main board 900 (e.g., disposed to be at least partially on the main board 900 as opposed to being disposed entirely within the perimeter of the hole, for example, and without limitation, the first board 910 may be disposed on the main board 900 and not in the hole 902) when the first surface 904 of the main board 900 is viewed from above (e.g., in the −z-axis direction). According to an embodiment, when the first board 910 is viewed in the z-axis direction, at least a portion of the first board 910 may overlap the main board 900, and at least a part of the remaining portion may overlap the second board 940 disposed in the through hole 902 in the main board 900. For example, the first board 910 may be coupled or connected to the main board 900. For example, the first board 910 and the main board 900 may be electrically and/or physically coupled or connected to each other through a conductive bonding method (e.g., soldering). According to an embodiment, the first board 910 may be made of a material having a dielectric constant relatively lower than that of the main board 900.

According to various embodiments, the wireless communication circuit 930 may be disposed in a manner of being inserted into the through hole 902 provided in at least a portion of the main board 900 (e.g., the printed circuit board 324 in FIG. 3C), as illustrated in FIG. 9B. For example, the wireless communication circuit 930 may include one chipset or package.

According to various embodiments, when disposed in the through hole 902 in the main board 900, the wireless communication circuit 930 may be coupled or connected to the first board 910 disposed on the first surface 904 of the main board 900. According to an embodiment, the first board 910 and the wireless communication circuit 930 may be electrically and/or physically coupled or connected to each other through a conductive bonding method (e.g., soldering).

According to various embodiments, the wireless communication circuit 930 may transmit and/or receive wireless signals in a predetermined frequency band via the plurality of antenna elements 920 disposed on the first board 910. According to an embodiment, the wireless communication circuit 930 (e.g., the third RFIC 226 in FIG. 2) may be electrically connected to at least one circuit (e.g., a communication processor (CP) 952 and/or a PMIC 954) disposed on the main board 900 via the first board 910 and the main board 900. For example, during transmission, the wireless communication circuit 930 may up-convert a baseband signal acquired from the communication processor 952 into an RF signal in a predetermined band. The RF signal may be transmitted to the plurality of antenna elements 920 via the first board 910. During reception, the wireless communication circuit 930 may down-convert an RF signal received through the plurality of antenna elements 920 (e.g., an array antenna) disposed on the first board 910 into a baseband signal, and may transmit the baseband signal to the communication processor 952. As another example, during transmission, the wireless communication circuit 930 may up-convert an IF signal (e.g., about 9 GHz to about 11 GHz) acquired from an intermediate frequency integrated circuit (IFIC) (e.g., the fourth RFIC 228 in FIG. 2) into an RF signal in a predetermined band. During reception, the wireless communication circuit 930 may down-convert the acquired RF signal received via the plurality of antenna elements 920 (e.g., an array antenna) disposed on the first board 910 into an IF signal and may transmit the IF signal to the IFIC.

According to various embodiments, the main board 900 may be disposed in the housing (e.g., the housing 310 in FIG. 3A) of an electronic device (e.g., the electronic device 300 in FIG. 3A). According to an embodiment, at least one circuit may be disposed on one surface (e.g., the first surface 904 and/or the second surface 906) of the main board 900. For example, the communication processor 952 and/or the power management integrate circuit (PMIC) 954 may be disposed on the first surface 904 (or the second surface 906) of the main board 900. A detailed description of the communication processor 952 and the PMIC 954 of FIGS. 9A and 9B may not be repeated here to avoid redundancy with that made with reference to FIGS. 4A, 4B, 4C, and/or 4F.

Figure 9C:
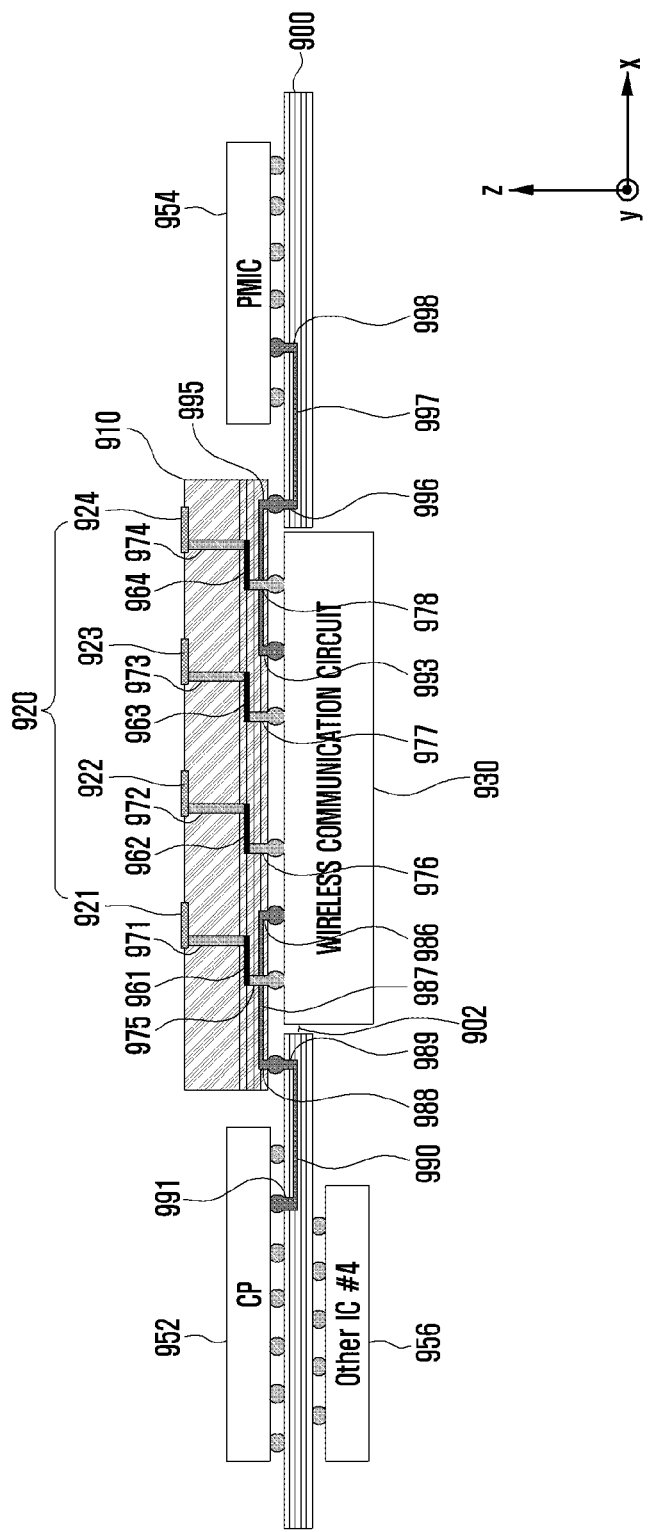
FIG. 9C is a cross-sectional view of the antenna module taken along line B-B in FIG. 9B according to various embodiments.
Figure 9D:
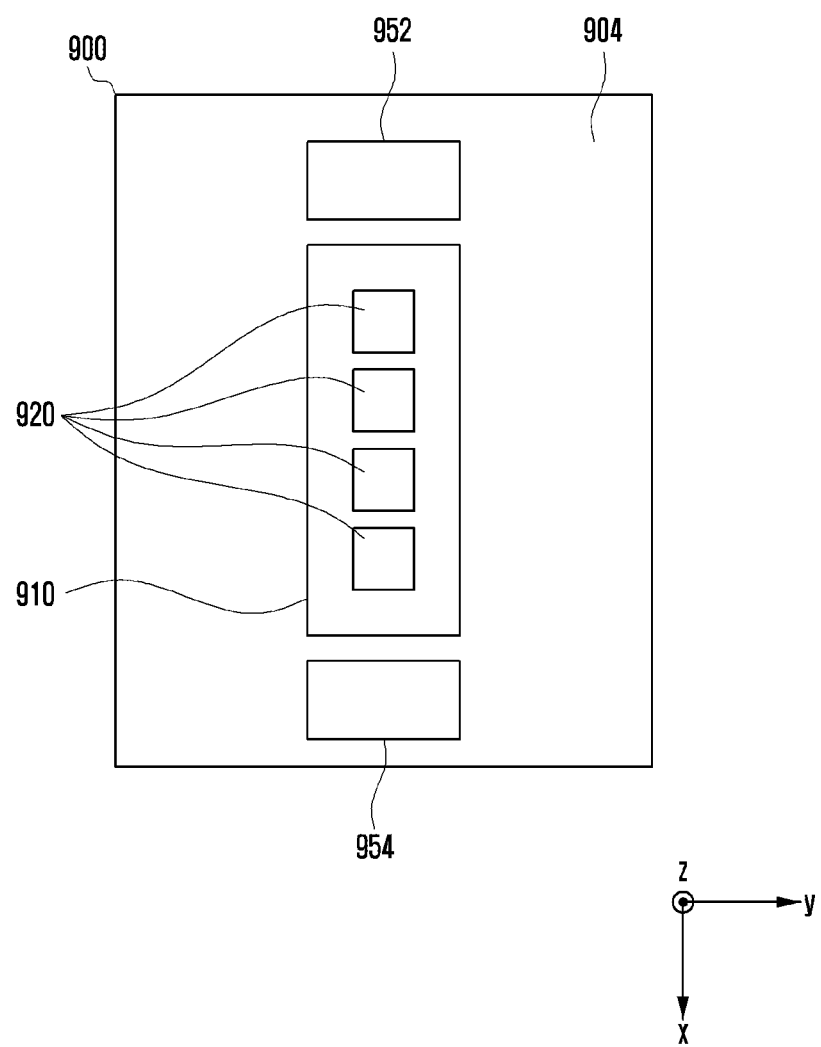
FIG. 9D is a plan view of the antenna module viewed in the −z axis direction in FIG. 9B according to various embodiments.
Figure 9E:
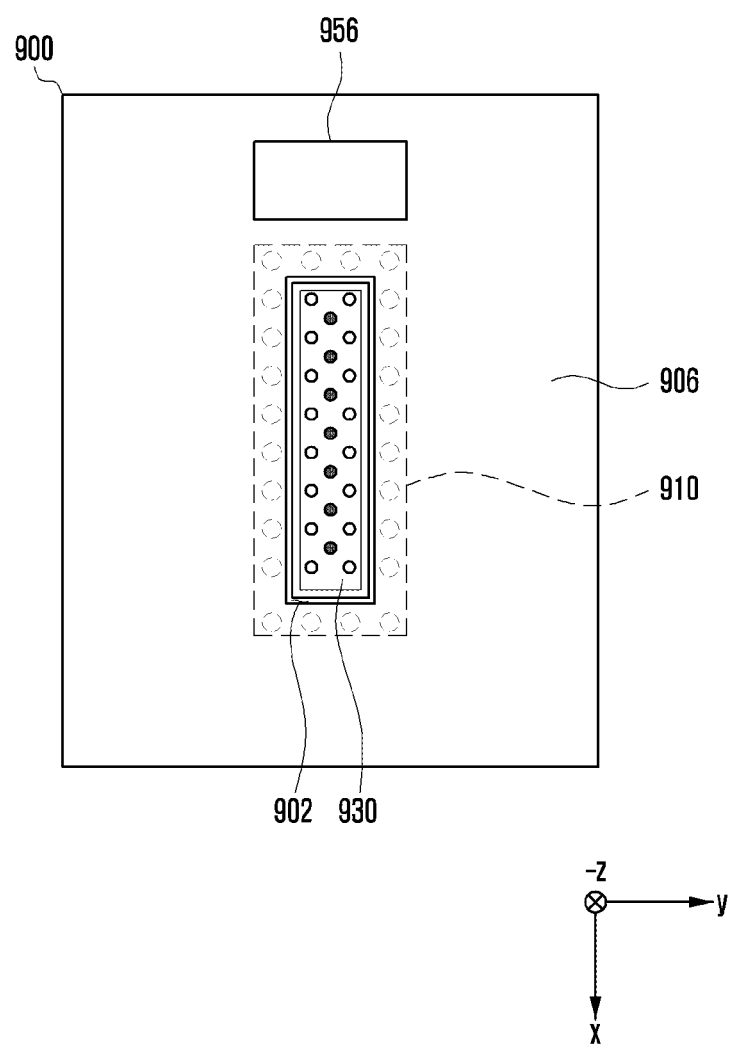
FIG. 9E is a plan view of the antenna module viewed in the z axis direction in FIG. 9B according to various embodiments.

FIG. 9C is a cross-sectional view of the antenna module taken along line B-B in FIG. 9B according to various embodiments. FIG. 9D is a plan view of the antenna module viewed in the −z axis direction in FIG. 9B according to various embodiments. FIG. 9E is a plan view of the antenna module viewed in the z axis direction in FIG. 9B according to various embodiments.

Referring to FIGS. 9C, 9D, and 9E, according to various embodiments, the wireless communication circuit 930 may be disposed in the through hole 902 provided in at least a portion of the main board 900 and may be coupled or connected to the first board 910 (the first board 910 at least partially overlapping a portion of the main board 900). According to an embodiment, when the first surface 904 of the main board 900 is viewed from above (e.g., in the z-axis direction), as illustrated in FIG. 9D, the first board 910 may be disposed so as to at least partially overlap the through hole 902 in the main board 900 and to at least partially overlap the main board 900 so as to be coupled or connected to the main board 900. According to an embodiment, when the second surface 906 of the main board 900 is viewed from above (e.g., in the z-axis direction), the wireless communication circuit 930 may be disposed in the through hole 902 in the main board 900, as illustrated in FIG. 9E.

According to various embodiments, the first board 910 may include a plurality of antenna elements 920 and/or a plurality of matching circuits 961, 962, 963 and 964. For example, the plurality of antenna elements 920 may include a first element 921, a second element 922, a third element 923, or a fourth element 924. According to an embodiment, the first element 921 may be electrically connected to the first matching circuit 961 via the first via 971. According to an embodiment, the second element 922 may be electrically connected to the second matching circuit 962 via the second via 972. According to an embodiment, the third element 923 may be electrically connected to the third matching circuit 963 via the third via 973. According to an embodiment, the fourth element 924 may be electrically connected to the fourth matching circuit 964 via the fourth via 974.

According to various embodiments, the first board 910 may be electrically and/or physically connected to the wireless communication circuit 930 through a conductive bonding method (e.g., soldering). According to an embodiment, the first matching circuit 961 of the first board 910 may be electrically connected to the wireless communication circuit 930 via the fifth via 975. According to an embodiment, the second matching circuit 962 of the first board 910 may be electrically connected to the wireless communication circuit 930 via the sixth via 976. According to an embodiment, the third matching circuit 963 of the first board 910 may be electrically connected to the wireless communication circuit 930 via the seventh via 977. According to an embodiment, the fourth matching circuit 964 of the first board 910 may be electrically connected to the wireless communication circuit 930 via the eighth via 978.

According to various embodiments, the wireless communication circuit 930 may be electrically connected to at least one circuit (e.g., the communication processor 952 and/or the PMIC 954) disposed on the main board 900 via the first board 910 and the main board 900. According to an embodiment, the wireless communication circuit 930 may be electrically connected to a first electrical wiring line 987 of the first board 910 via the fourteenth via 986 in the first board 910. The first electrical wiring line 987 of the first board 910 may be electrically connected to the second electrical wiring line 990 of the main board 900 via the fifteenth via 988 and the sixteenth via 989 of the main board 900. The second electrical wiring line 990 of the main board 900 may be electrically connected to the communication processor 952 via the seventeenth via 991. For example, the fifteenth via 988 and the sixteenth via 989 may be electrically and/or physically connected to each other through a conductive bonding method (e.g., soldering). For example, the wireless communication circuit 930 may transmit and/or receive a signal (e.g., a control signal, a baseband signal, or an IF signal) to/from the communication processor 952 electrically connected via the first board 910 and the main board 900.

According to an embodiment, the wireless communication circuit 930 may be electrically connected to the third electrical wiring line 994 of the first board 910 via the nineteenth via 993 in the first board 910. The third electrical wiring line 994 of the first board 910 may be electrically connected to the fourth electrical wiring 997 of the main board 900 via the twentieth via 995 and the twenty-first via 996 of the main board 900. The fourth electrical wiring line 997 of the main board 900 may be electrically connected to the PMIC 959 via the twenty-second via 998. For example, the twentieth via 995 and the twenty-first via 996 may be electrically and/or physically connected to each other through a conductive bonding method (e.g., soldering). For example, the wireless communication circuit 930 may receive a power signal from the PMIC 959 electrically connected thereto via the first board 910 and the main board 900.

According to various embodiments, the main board 900 may include at least one circuit. According to an embodiment, the communication processor (CP) 952 and/or the PMIC 954 may be disposed on the first surface 904 of the main board 900. According to an embodiment, one or more other circuits 956 may be disposed on the second surface 906 of the main board 900.

Figure 9F:
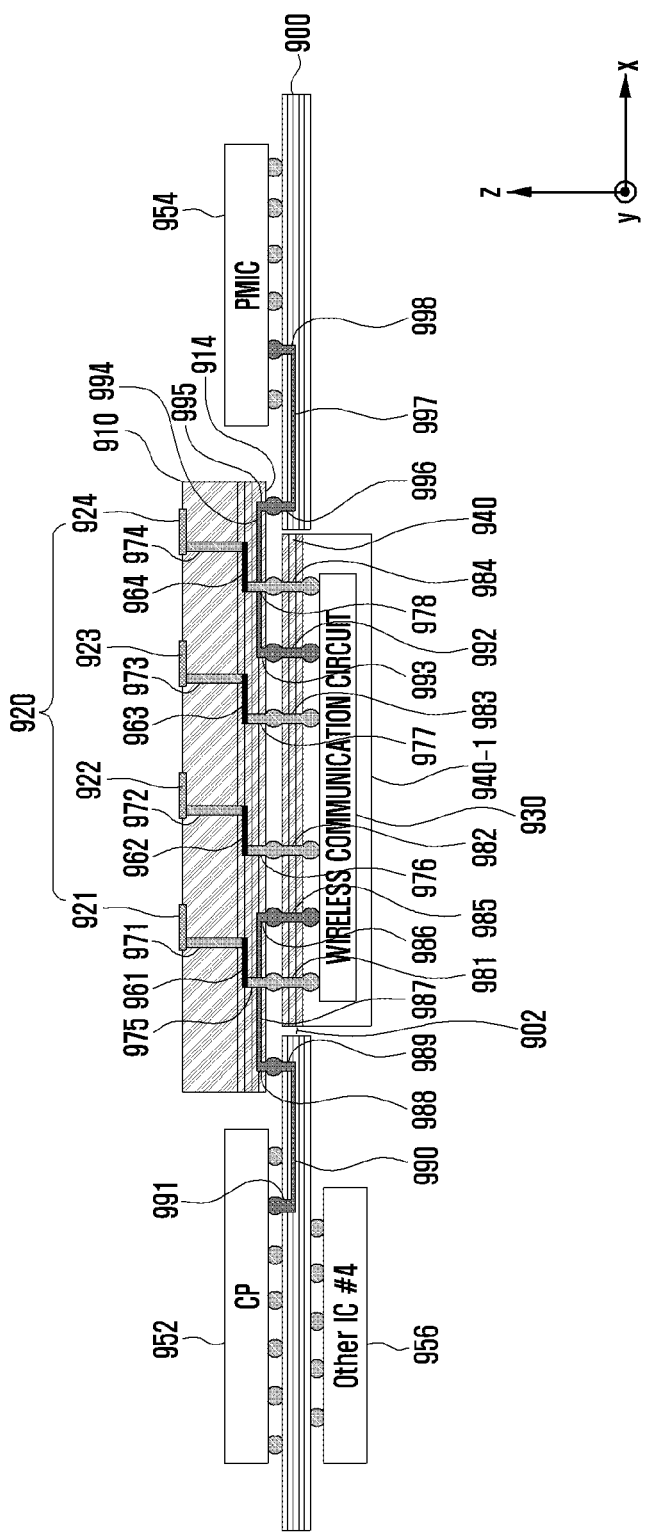
FIG. 9F illustrates an example wireless communication circuit disposed in an antenna module according to various embodiments.

FIG. 9F is a cross-sectional view illustrating an example wireless communication circuit disposed in an antenna module according to various embodiments.

Referring to FIG. 9F, according to various embodiments, the wireless communication circuit 930 may be disposed on one surface of the second board 940. The second board 940 may be disposed in the through hole 902 provided in at least a portion of the main board 900 and may be coupled or connected to the first board 910. According to an embodiment, the wireless communication circuit 930 may be fixed on one surface (e.g., the second surface 934) of the second board 440 by a protective layer 940-1 (e.g., resin). According to an embodiment, when the second surface 906 of the main board 900 is viewed from above (e.g., in the z-axis direction), the second board 940 may be disposed in the through hole 902 in the main board 900. A detailed description of the first board 910 of FIG. 9F will be omitted to avoid redundancy with that made with reference to FIG. 9C.

According to various embodiments, the first board 910 may be electrically and/or physically connected to the second board 940 through a conductive bonding method. According to an embodiment, the first matching circuit 961 of the first board 910 may be electrically connected to the wireless communication circuit 930 via the fifth via 975 of the first board 910 and the ninth via 981 of the second board 940. For example, the fifth via 975 and the ninth via 981 may be electrically and/or physically connected to each other through a conductive bonding method (e.g., soldering). According to an embodiment, the second matching circuit 962 of the first board 910 may be electrically connected to the wireless communication circuit 930 via the sixth via 976 of the first board 910 and the tenth via 982 of the second board 940. For example, the sixth via 976 and the tenth via 982 may be electrically and/or physically connected to each other through a conductive bonding method (e.g., soldering). According to an embodiment, the third matching circuit 963 of the first board 910 may be electrically connected to the wireless communication circuit 930 via the seventh via 977 of the first board 910 and the eleventh via 983 of the second board 940. For example, the seventh via 977 and the eleventh via 983 may be electrically and/or physically connected to each other through a conductive bonding method (e.g., soldering). According to an embodiment, the fourth matching circuit 964 of the first board 910 may be electrically connected to the wireless communication circuit 930 via the eighth via 978 of the first board 910 and the twelfth via 984 of the second board 940. For example, the eighth via 978 and the twelfth via 984 may be electrically and/or physically connected to each other through a conductive bonding method (e.g., soldering).

According to various embodiments, the wireless communication circuit 930 may be electrically connected to at least one circuit (e.g., the communication processor 952 and/or the PMIC 954) disposed on the main board 900 via the first board 910, the second board 940, and the main board 900. According to an embodiment, the wireless communication circuit 930 may be electrically connected to the first electrical wiring line 987 of the first board 910 via the thirteenth via 985 of the second board 940 and the fourteenth via 986 of the first board 910. The first electrical wiring line 987 of the first board 910 may be electrically connected to the second electrical wiring line 990 of the main board 900 via the fifteenth via 988 and the sixteenth via 989 of the main board 900. The second electrical wiring line 990 of the main board 900 may be electrically connected to the communication processor 952 via the seventeenth via 991. For example, the thirteenth via 985 and the fourteenth via 986 may be electrically and/or physically connected to each other through a conductive bonding method (e.g., soldering). For example, the fifteenth via 988 and the sixteenth via 989 may be electrically and/or physically connected to each other through a conductive bonding method (e.g., soldering). For example, the wireless communication circuit 930 may transmit and/or receive a signal (e.g., a control signal, a baseband signal, or an IF signal) to/from the communication processor 952 electrically connected via the first board 910, the second board 940, and the main board 900.

According to an embodiment, the wireless communication circuit 930 may be electrically connected to the third electrical wiring line 994 of the first board 910 via the eighteenth via 992 of the second board 940 and the nineteenth via 993 of the first board 910. The third electrical wiring line 994 of the first board 910 may be electrically connected to the fourth electrical wiring 997 of the main board 900 via the twentieth via 995 and the twenty-first via 996 of the main board 900. The fourth electrical wiring line 997 of the main board 900 may be electrically connected to the PMIC 959 via the twenty-second via 998. For example, the eighteenth via 992 and the nineteenth via 993 may be electrically and/or physically connected to each other through a conductive bonding method (e.g., soldering). For example, the twentieth via 995 and the twenty-first via 996 may be electrically and/or physically connected to each other through a conductive bonding method (e.g., soldering). For example, the wireless communication circuit 930 may receive a power signal from the PMIC 959 electrically connected thereto via the first board 910, the second board 940, and the main board 900.

According to various embodiments, the plurality of matching circuits 961, 962, 963, and 964 may be disposed in a bonding region between the first board 910 and the second board 940 (or the wireless communication circuit 930). According to an embodiment, at least some of the plurality of matching circuits 961, 962, 963, and 964 (e.g., the first matching circuit 961 and the third matching circuit 963) may be disposed on the first surface 932 of the second board 940 (or the wireless communication circuit 930). The remaining ones of the plurality of matching circuits 961, 962, 963 and 964 (e.g., the second matching circuit 962 and the fourth matching circuit 964) may be disposed on the second surface 914 of the first board 910. According to an embodiment, the plurality of matching circuits 961, 962, 963, and 964 may be disposed on the second surface 914 of the first board 910 or the first surface 932 of the second board 940 (or the wireless communication circuit 930).

According to various embodiments, in the electronic device 101 or 300, by disposing at least a portion of the wireless communication circuit 930 or the second board 940 on which the wireless communication circuit 930 is disposed in the through hole 902 in the main board 900, it is possible to reduce the space (e.g., the height) required by the antenna module.

Figure 10:
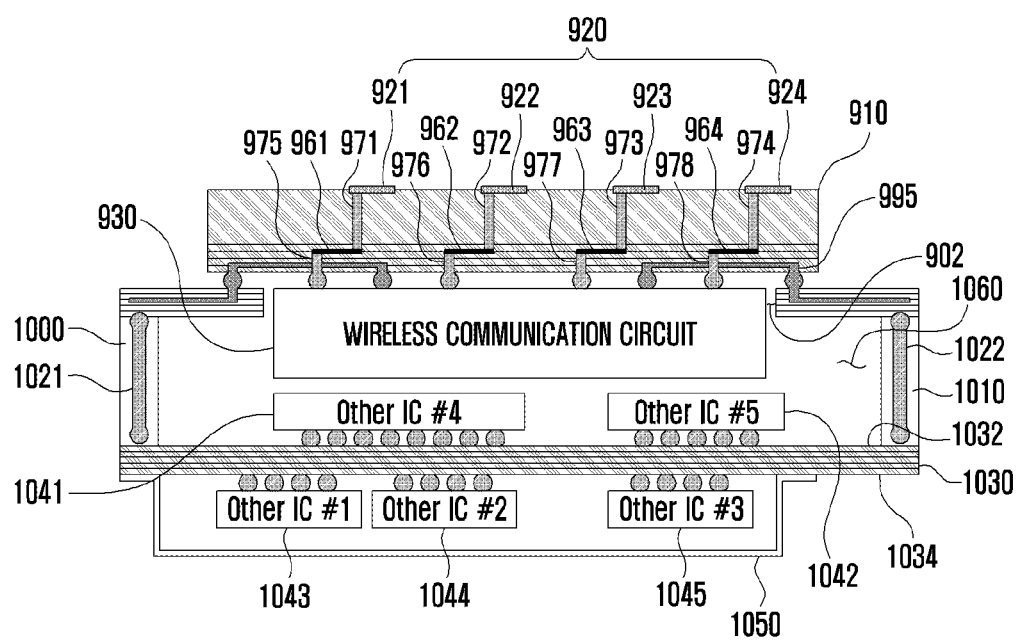
FIG. 10 is a cross-sectional view illustrating an example structure of an antenna module using an interposer according to various embodiments.

FIG. 10 is a cross-sectional view illustrating an example structure of an antenna module using an interposer according to various embodiments. According to an embodiment, the antenna module of FIG. 10 may be at least partially similar to the third antenna module 246 of FIG. 2, or may include various embodiments of the antenna module.

Referring to FIG. 10, according to various embodiments, the main board 900 may be electrically and/or physically coupled to another main board 1030 via the interposers 1000 and 1010. According to an embodiment, the main board 900 may be electrically and/or physically connected to the other main board 1030 via the twenty-third via 1021 of the first interposer 1000 and the twenty-fourth via 1022 of the second interposer 1010.

According to various embodiments, the main board 900 and/or the other main board 1030 may include at least one circuit disposed in the internal space 1060 secured by the interposers 1000 and 1010. According to an embodiment, the wireless communication circuit 930 may be located in a space 1060 defined by the main board 900 and the other main board 1030. According to an embodiment, the first circuit 1041 and/or the second circuit 1042 may be disposed on the first surface 1032 of the other main board 1030, which defines the internal space 1060 secured by the interposers 1000 and 1010. According to an embodiment, the third circuit 1043, the fourth circuit 1044, and/or the fifth circuit 1045 may be disposed on the second surface 1034 of the other main board 1030 facing away from the first surface 1032.

According to an embodiment, the other main board 1030 may further include a shield member 1050. For example, the shield member 1050 may be disposed on a portion of the other main board 1030 (e.g., the second surface 1034) such that the third circuit 1043, the fourth circuit 1044, and/or the fifth circuit 1045 disposed on the second surface 1034 of the other main board 1030 are electromagnetically shielded. For example, the shield member 1050 may include a shield can.

Figure 11B:
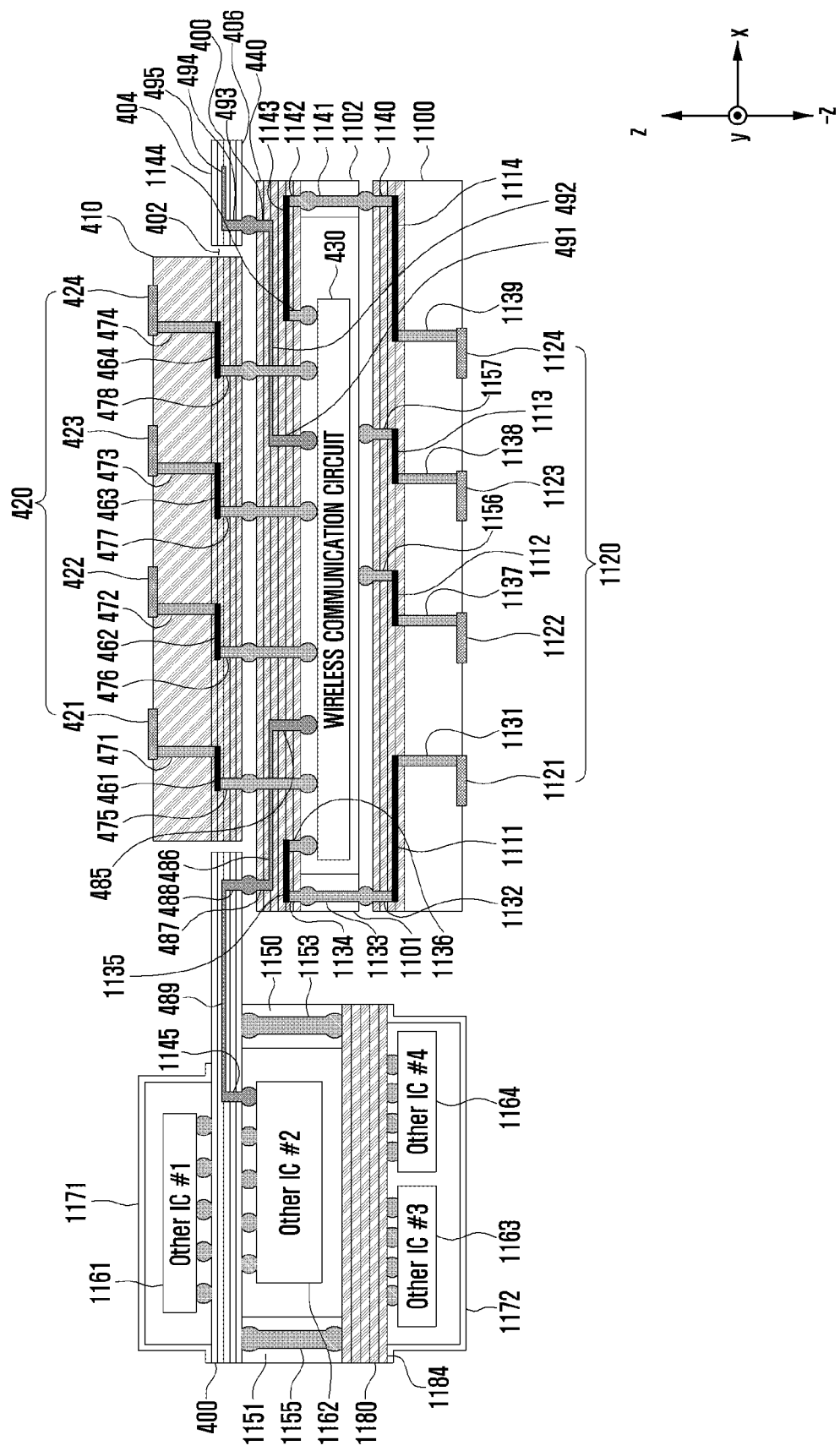

FIGS. 11A and 11B are cross-sectional views each illustrating an example structure of an antenna module including a plurality of array antennas according to various embodiment. According to an embodiment, the antenna modules of FIGS. 11A and 11B may be at least partially similar to the third antenna module 246 of FIG. 2, or may include various embodiments of the antenna module.

According to various embodiments to be described with reference to FIG. 11A, the antenna module may include a first board 410 including a plurality of antenna elements 420, a wireless communication circuit 430 electrically connected to the first board 410, and a third board 1100 including a plurality of other antenna elements. A detailed description of the first board 410 and the wireless communication circuit 430 of FIG. 11A will be omitted so as to avoid redundancy with that made with reference to FIGS. 4A, 4B, 4C and/or 4F.

According to various embodiments, the first board 410 may include a plurality of antenna elements 420 arranged to form a beam in a first direction (e.g., in the z-axis direction). For example, the plurality of antenna elements 420 may include a first element 421, a second element 422, a third element 423, or a fourth element 424. According to an embodiment, at least a portion of the first board 410 may be disposed in the through hole 402 provided in at least a portion of the main board 400 (e.g., the printed circuit board 324 in FIG. 3C). For example, at least a portion of the first board 410 may be disposed in the through hole 402 in the main board 400 and may be coupled or connected to the wireless communication circuit 430 disposed on the second surface 406 of the main board 400.

According to various embodiments, the third board 1100 may include a plurality of other antenna elements 1120 arranged to form a beam in a second direction (e.g., in the −z-axis direction). For example, the plurality of other antenna elements 1120 may include a fifth element 1121, a sixth element 1122, a seventh element 1123, or an eighth element 1124.

According to various embodiments, the plurality of other antenna elements 1120 disposed on the third board 1100 may be electrically connected to the wireless communication circuit 430 via the third board 1100. According to an embodiment, the fifth element 1121 may be electrically connected to the fifth matching circuit 1111 of the third board 1100 via a thirty-first via 1131 of the third board 1100. The fifth matching circuit 1111 may be electrically connected to the wireless communication circuit 430 via a thirty-second via 1132. According to an embodiment, the sixth element 1122 may be electrically connected to the sixth matching circuit 1112 of the third board 1100 via a thirty-sixth via 1137 of the third board 1100. The sixth matching circuit 1112 may be electrically connected to the wireless communication circuit 430 via a forty-sixth via 1156. According to an embodiment, the seventh element 1123 may be electrically connected to the seventh matching circuit 1113 of the third board 1100 via a thirty-seventh via 1138 of the third board 1100. The seventh matching circuit 1113 may be electrically connected to the wireless communication circuit 430 via a forty-seventh via 1157. According to an embodiment, the eighth element 1124 may be electrically connected to the eighth matching circuit 1114 of the third board 1100 via a thirty-eighth via 1139 of the third board 1100. The eighth matching circuit 1114 may be electrically connected to the wireless communication circuit 430 via a thirty-ninth via 1140.

According to various embodiments, the main board 400 may be electrically and/or physically coupled to another main board 1180 via interposers 1150 and 115. According to an embodiment, the main board 400 may be electrically and/or physically connected to the other main board 1180 via a forty-fourth via 1153 of a third interposer 1150 and a forty-fifth via 1155 of the fourth interposer 1151.

According to various embodiments, one or more circuits 1161, 1162, 1163, and/or 1164 may be disposed on the main board 400 and/or the other main board 1180. According to an embodiment, a first circuit (e.g., other IC #1) 1161 may be disposed on the first surface 404 of the main board 400. For example, the main board 400 may further include a first shield member 1171. The first shield member 1171 may be disposed on a portion of the main board 400 (e.g., the first surface 404) such that the first circuit 1161 disposed on the first surface 404 of the main board 400 is electromagnetically shielded. For example, the first shield member 1171 may include a shield can.

According to an embodiment, the main board 400 and the other main board 1180 may include at least one circuit disposed in the internal space 1190 secured by the interposers 1150 and 1151. For example, the second circuit (e.g., other IC #2) 1162 may be disposed on the second surface 406 of the main board 400, which defines the internal space 1190 secured by the interposers 1150 and 1151. According to an embodiment, the second circuit 1162 may be electrically connected to the wireless communication circuit 430 via the main board 400. For example, the wireless communication circuit 430 may be electrically connected to the second electrical wiring line 489 of the main board 400 via the fifteenth via 488 of the main board 400. The second electrical wiring line 489 of the main board 400 may be electrically connected to the second circuit 1162 via a forty-third via 1145. According to an embodiment, the third circuit (e.g., other IC #3) 1163 and/or a fourth circuit (e.g., other IC #4) 1164 may be disposed on the second surface 1184 of the other main board 1180. For example, the other main board 1180 may further include a second shield member 1172. The second shield member 1172 may be disposed on a portion of the other main board 1180 (e.g., the second surface 1184) such that the third circuit 1163 and/or the fourth circuit 1164 disposed on the second surface 1184 of the other main board 1180 are electromagnetically shielded. For example, the second shield member 1172 may include a shield can.

According to various embodiments to be described with reference to FIG. 11B, the antenna module may include a first board 410 including a plurality of antenna elements 420, a second board 440 electrically connected to the first board 410, a wireless communication circuit 430 disposed on the second board 440, and a third board 1100 including a plurality of other antenna elements. According to an embodiment, a detailed description of the first board 410 and the wireless communication circuit 430 of FIG. 11B will be omitted so as to avoid redundancy with that made with reference to FIGS. 4A, 4B, 4C and/or 4F.

According to various embodiments, the first board 410 may include a plurality of antenna elements 420 arranged to form a beam in a first direction (e.g., in the z-axis direction). According to an embodiment, at least a portion of the first board 410 may be disposed in the through hole 402 provided in at least a portion of the main board 400 (e.g., the printed circuit board 324 in FIG. 3C). For example, at least a portion of the first board 410 may be disposed in the through hole 402 in the main board 400 and may be coupled or connected to the second board 440 disposed on the second surface 406 of the main board 400.

According to various embodiments, the plurality of other antenna elements 1120 disposed on the third board 1100 may be electrically connected to the wireless communication circuit 430 disposed on the second board 440 via the third board 1100, the interposers 1101 and 1102, and the second board 440. According to an embodiment, the fifth element 1121 may be electrically connected to the fifth matching circuit 1111 of the third board 1100 via a thirty-first via 1131 of the third board 1100. The fifth matching circuit 1111 may be electrically connected to a fifth electrical wiring line 1135 of the second board 440 via a thirty-second via 1132, a thirty-third via 1133 of the first interposer 1101, and a thirty-fourth via 1134 of the second board 440. The fifth electrical wiring line 1135 may be electrically connected to the wireless communication circuit 430 via a thirty-fifth via 1136. For example, the fifth element 1121 may be electrically connected to the wireless communication circuit 430 via the third board 1100, the first interposer 1101, and the second board 440. According to an embodiment, the sixth element 1122 may be electrically connected to the sixth matching circuit 1112 of the third board 1100 via a thirty-sixth via 1137 of the third board 1100. The sixth matching circuit 1112 may be electrically connected to the wireless communication circuit 430 via a forty-sixth via 1156. According to an embodiment, the seventh element 1123 may be electrically connected to the seventh matching circuit 1113 of the third board 1100 via a thirty-seventh via 1138 of the third board 1100. The seventh matching circuit 1113 may be electrically connected to the wireless communication circuit 430 via a forty-seventh via 1157.

According to an embodiment, the eighth element 1124 may be electrically connected to the eighth matching circuit 1114 of the third board 1100 via a thirty-eighth via 1139 of the third board 1100. The eighth matching circuit 1114 may be electrically connected to a sixth electrical wiring line 1143 of the second board 440 via a thirty-ninth via 1140, a fortieth via 1141 of the second interposer 1102, and a forty-first via 1142 of the second board 440. The sixth electrical wiring line 1143 may be electrically connected to the wireless communication circuit 430 via a forty-second via 1144. For example, the eighth element 1124 may be electrically connected to the wireless communication circuit 430 via the third board 1100, the second interposer 1102, and the second board 440.

Figure 12A:
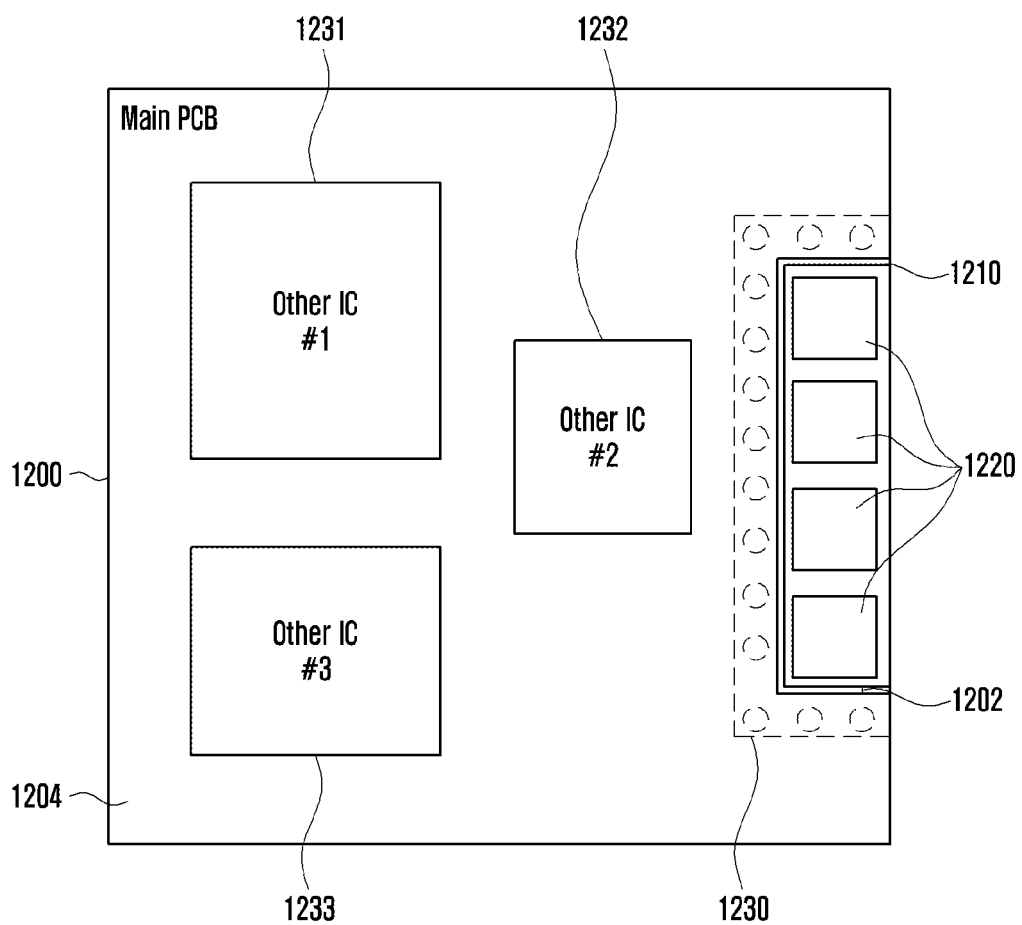
FIGS. 12A and 12B are plan views illustrating an example structure in which a through hole is disposed in a partial region of an outer edge of a main board according to various embodiments.
Figure 12B:
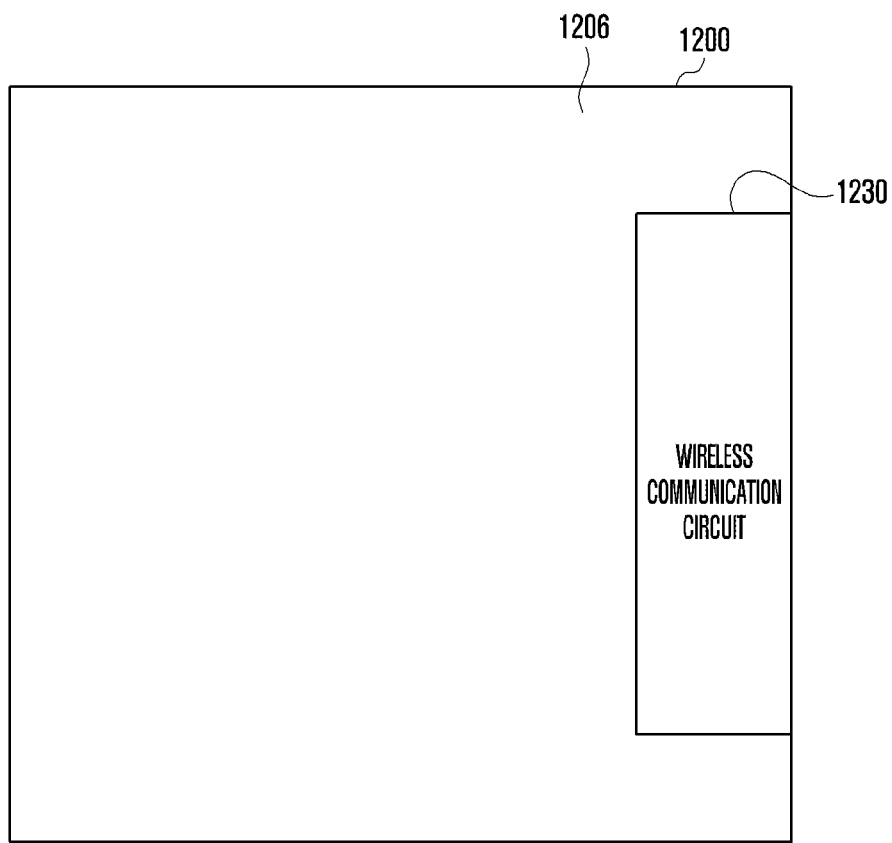

FIGS. 12A and 12B are plan views illustrating an example structure in which a through hole is disposed in a partial region of an outer edge of a main board according to various embodiments. FIG. 12A is a plan view of the antenna module embodiments viewed in the −z-axis direction in FIG. 4B according to various embodiments. FIG. 12B is a plan view of the antenna module embodiments viewed in the z-axis direction in FIG. 4B according to various embodiments.

According to various embodiments to be described with reference to FIGS. 12A and 12B, the antenna module may include a first board 1210 including a plurality of antenna elements 1220 and a wireless communication circuit 1230 electrically connected to the first board 1210. According to an embodiment, the first board 1210 may include a plurality of antenna elements 1220 arranged to form a directional beam.

According to various embodiments, the first board 1210 may be disposed in a hole (or a groove) 1202 provided in at least a portion of an edge portion of the main board 1200 (e.g., the printed circuit board 324 in FIG. 3C).

According to an embodiment, when disposed in the hole 1202 in the main board 1200, at least a portion of the first board 1210 may be coupled or connected to the wireless communication circuit 1230 disposed on the second surface 1206 of the main board 1200. For example, when the first surface 1204 of the main board 1200 is viewed from above (e.g., in the −z-axis direction), the first board 1210 may be disposed in the hole 1202 in the main board 1200, as illustrated in FIG. 12A. For example, when the second surface 1206 of the main board 1200 is viewed from above (e.g., in the z-axis direction), as illustrated in FIG. 12B, the wireless communication circuit 1230 may be disposed so as to overlap the hole 1202 and to at least partially overlap the main board 1200 so as to be coupled or connected to the main board 1200.

According to various embodiments, one or more circuits 1231, 1232, and/or 1233 may be disposed on one surface (e.g., the first surface 1204 and/or the second surface 1206) of the main board 1200.

According to various embodiments, the wireless communication circuit 1230 may be disposed in the hole (or a groove) 1202 provided in at least a portion of an edge portion of the main board 1200 (e.g., the printed circuit board 324 in FIG. 3C).

According to an embodiment, when disposed in the hole 1202 in the main board 1200, at least a portion of the wireless communication circuit 1230 may be coupled or connected to the first board 1210 disposed on the first surface 1204 of the main board 1200. For example, when the second surface 1206 of the main board 1200 is viewed from above (e.g., in the z-axis direction), the wireless communication circuit 1230 may be disposed in the hole 1202 in the main board 1200. For example, when the first surface 1204 of the main board 1200 is viewed from above (e.g., in the −z-axis direction), the first board 1210 may be disposed so as to overlap the through hole 1202 and to at least partially overlap the main board 1200 so as to be coupled or connected to the main board 1200.

Figure 13:
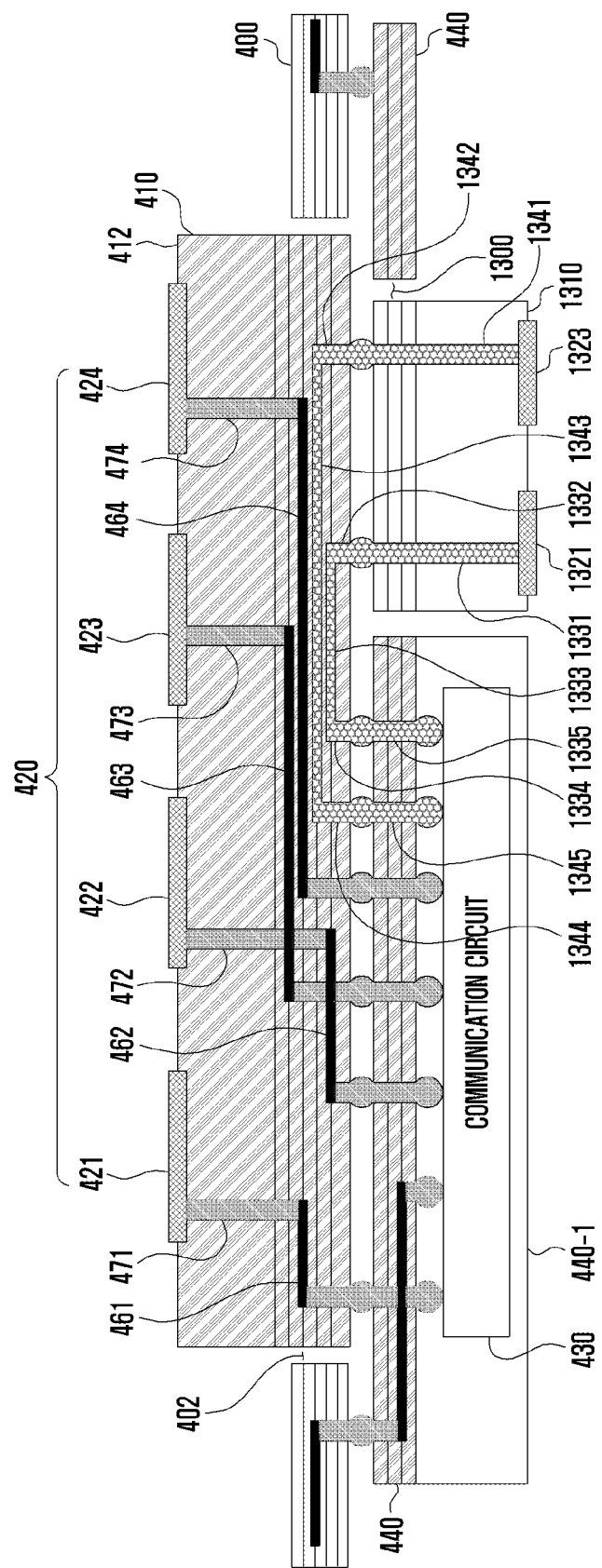
FIG. 13 is a cross-sectional view illustrating an example structure of an antenna module including a plurality of array antennas according to various embodiments.

FIG. 13 is a cross-sectional view illustrating an example structure of an antenna module including a plurality of array antennas according to various embodiments. According to an embodiment, the antenna module of FIG. 13 may be at least partially similar to the third antenna module 246 of FIG. 2, or may include various embodiments of the antenna module.

According to various embodiments to be described with reference to FIG. 13, the antenna module may include a first board 410 including a plurality of antenna elements 420, a second board 440 electrically connected to the first board 410, a wireless communication circuit 430 disposed on the second board 440, and a third board 1310 including a plurality of other antenna elements 1321 and/or 1323. According to an embodiment, a detailed description of the first board 410 and the wireless communication circuit 430 of FIG. 13 will be omitted so as to avoid redundancy with that made with reference to FIGS. 4A, 4B, 4C and/or 4F.

According to various embodiments, the first board 410 may include a plurality of antenna elements 420 arranged to form a beam in a first direction (e.g., in the z-axis direction). For example, the plurality of antenna elements 420 may include a first element 421, a second element 422, a third element 423, or a fourth element 424. According to an embodiment, at least a portion of the first board 410 may be disposed in a first through hole 402 provided in at least a portion of the main board 400 (e.g., the printed circuit board 324 in FIG. 3C). For example, at least a portion of the first board 410 may be disposed in the first through hole 402 in the main board 400 and may be coupled or connected to the second board 440 disposed on the second surface 406 of the main board 400.

According to various embodiments, the third board 1310 may include a plurality of other antenna elements 1321 and/or 1323 arranged to form a beam in a second direction (e.g., in the −z-axis direction). According to an embodiment, at least a portion of the third board 1310 may be disposed in a second through hole 1300 provided in at least a portion of the second board 440. For example, at least a portion of the third board 1310 may be disposed in the second through hole 1300 in the main board 400 and may be coupled or connected to the first board 410 disposed in the first through hole 402 in the main board 400. For example, the second through hole 1300 may be disposed so as to at least partially overlap the first through hole 402.

According to various embodiments, the plurality of antenna elements 1321 and/or 1323 disposed on the third board 1310 may be electrically connected to the wireless communication circuit 430 disposed on the second board 440 via the third board 1310, the first board 410, and the second board 440. According to an embodiment, the fifth element 1321 may be electrically connected to the seventh electrical wiring line 1333 of the first board 410 via a fifty-second via 1331 of the third board 1310 and a fifth-third via 1332 of the first board 410. The seventh electrical wiring line 1333 may be electrically connected to the wireless communication circuit 430 via a fifty-fourth via 1334 of the first board 410 and a fifty-fifth via 1335 of the second board 440. For example, the fifth element 1321 may be electrically connected to the wireless communication circuit 430 via the third board 1310, the first board 410, and the second board 440.

According to an embodiment, the sixth element 1323 may be electrically connected to the eighth electrical wiring line 1343 of the first board 410 via a fifty-sixth via 1341 of the third board 1310 and a fifth-seventh via 1342 of the first board 410. The eighth electrical wiring line 1343 may be electrically connected to the wireless communication circuit 430 via a fifty-eighth via 1344 of the first board 410 and a fifty-ninth via 1345 of the second board 440. For example, the sixth element 1323 may be electrically connected to the wireless communication circuit 430 via the third board 1310, the first board 410, and the second board 440.

According to various embodiments, in the electronic device 101 or 300, by disposing the first board 410 including the plurality of antenna elements 420 (e.g., an array antenna) in the first through hole 402 in the main board 400 and disposing the third board 1310 including a plurality of other antenna elements 1321 and/or 1323 (e.g., an array antenna) in the second through hole 1300 in the second board 440, it is possible to reduce the space (e.g., the height) required by the antenna module.

Figure 14:
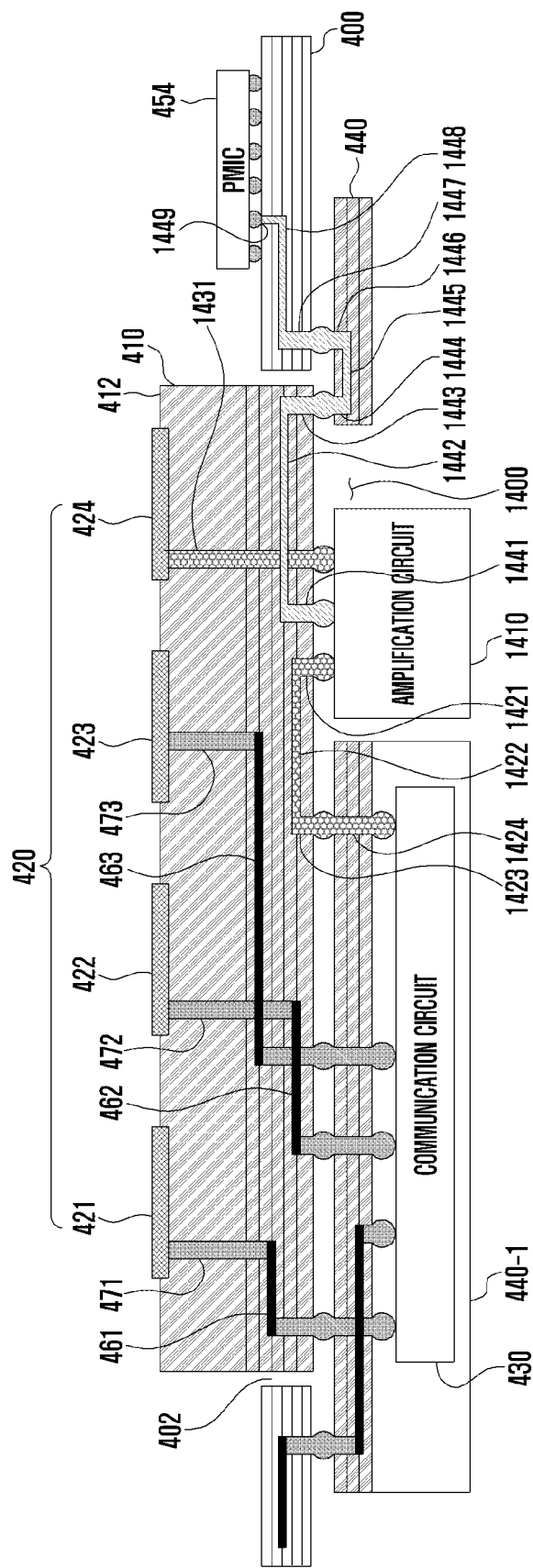
FIG. 14 is a cross-sectional view illustrating an arrangement of an amplification circuit according to various embodiments.

FIG. 14 is a cross-sectional view illustrating an example configuration of an amplification circuit according to various embodiments. According to an embodiment, the antenna module of FIG. 14 may be at least partially similar to the third antenna module 246 of FIG. 2, or may include various embodiments of the antenna module.

According to various embodiments to be described with reference to FIG. 14, the antenna module may include a first board 410 including a plurality of antenna elements 420, a second board 440 electrically connected to the first board 410, a wireless communication circuit 430 disposed on the second board 440, and an amplification circuit (e.g., mmW AMP) 1410. A detailed description of the first board 410 and the wireless communication circuit 430 of FIG. 14 will be omitted so as to avoid redundancy with that made with reference to FIGS. 4A, 4B, 4C and/or 4F.

According to various embodiments, the first board 410 may include a plurality of antenna elements 420 arranged to form a beam in a first direction (e.g., in the z-axis direction). For example, the plurality of antenna elements 420 may include a first element 421, a second element 422, a third element 423, or a fourth element 424. According to an embodiment, at least a portion of the first board 410 may be disposed in a first through hole 402 provided in at least a portion of the main board 400 (e.g., the printed circuit board 324 in FIG. 3C). For example, at least a portion of the first board 410 may be disposed in the first through hole 402 in the main board 400 and may be coupled or connected to the second board 440 disposed on the second surface 406 of the main board 400.

According to various embodiments, at least a portion of the amplification circuit 1410 may be disposed in a second through hole 1400 provided in at least a portion of the second board 440. For example, at least a portion of the amplification circuit 1410 may be disposed in the second through hole 1400 in the second board 440 and may be coupled or connected to the first board 410 disposed in the first through hole 402 in the main board 400. For example, the second through hole 1400 may be disposed so as to at least partially overlap the first through hole 402.

According to various embodiments, the amplification circuit 1410 may be electrically connected to the plurality of antenna elements 420 and/or the wireless communication circuitry 430 via the first board 410 and/or the second board 440.

According to an embodiment, the amplification circuit 1410 may be electrically connected to a ninth electrical wiring line 1422 of the first board 410 via a sixtieth via 1421 in the first board 410. The ninth electrical wiring line 1422 may be electrically connected to the wireless communication circuit 430 via a sixty-first via 1423 of the first board 410 and a sixty-second via 1424 of the second board 440.

According to an embodiment, the amplification circuit 1410 may be electrically connected to the fourth antenna element 424 via a sixty-third via 1431 in the first board 410. As an example, the amplification circuit 1410 may be electrically connected to the first antenna element 421, the second antenna element 422 and/or the third antenna element 423 via respective via (not illustrated) included in the first board 410.

According to an embodiment, the amplification circuit 1410 may be electrically connected to a tenth electrical wiring 1442 of the first board 410 via a sixty-fourth via 1441 of the first board 410. The tenth electrical wiring line 1442 may be electrically connected to an eleventh electrical wiring line 1445 of the second board 440 via a sixty-fifth via 1443 of the first board 410 and a sixty-sixth via 1444 of the second board 440. The eleventh electrical circuit 1445 may be electrically connected to a twelfth electrical wiring line 1448 of the main board 400 via a sixty-seventh via 1446 of the second board 440 and a sixty-eighth via 1447 of the main board 400. The twelfth electrical wiring line 1448 may be electrically connected to the PMIC 454 via the sixty-ninth via 1449 of the main board 400. For example, the amplification circuit 1410 may be electrically connected to the PMIC 454 disposed on the main board 400 via the first board 410 and the second board 420.

According to various example embodiments, an electronic device (e.g., the electronic device 101 in FIG. 1 or FIG. 2 or the electronic device 300 in FIGS. 3A to 3C) includes: a housing (e.g., the housing 310 in FIG. 3A); a main board (e.g., the main board 900 in FIG. 9A or FIG. 10) disposed in an internal space of the housing and including a first surface (e.g., the first surface 904 in FIG. 9A or FIG. 10) oriented in a first direction, a second surface (e.g., the second surface 906 in FIG. 9A or FIG. 10) facing a second direction opposite the first direction, and a through hole (e.g., th through hole 902 in FIG. 9A or FIG. 10); and an antenna module disposed on the main board. The antenna module includes: a board (e.g., the first board 910 in FIG. 9A or FIG. 10) including a plurality of antenna elements (e.g., the plurality of antenna elements 920 in FIG. 9A or FIG. 10); and a wireless communication circuit (e.g., the wireless communication circuit 930 in FIG. 9A or FIG. 10) at least partially disposed in the through hole and electrically connected to the board, the wireless communication circuit configured to transmit and/or receive a wireless signal in a predetermined frequency band via the plurality of antenna elements.

According to various example embodiments, the board may be disposed to at least partially overlap the main board when the second surface of the main board is viewed from above.

According to various example embodiments, the board and the wireless communication circuit may be electrically and/or physically coupled to each other through a conductive bonding method.

According to various example embodiments, the board may be coupled or connected to the main board, and the wireless communication circuit may be coupled or connected to the board.

According to various example embodiments, the main board may include at least one circuit, and the wireless communication circuit may be electrically connected to the at least one circuit via the board and the main board.

According to various example embodiments, an electronic device (e.g., the electronic device 101 in FIG. 1 or FIG. 2 or the electronic device 300 in FIGS. 3A to 3C) includes: a housing (e.g., the housing 310 in FIG. 3A); a main board (e.g., the main board 400 in FIG. 4A, FIG. 6, FIG. 7A, FIG. 8A, FIG. 8B, FIG. 13, or FIG. 14) disposed in an internal space of the housing and including a first surface (e.g., the first surface 404 in FIG. 4A, FIG. 6, FIG. 7A, FIG. 8A, FIG. 8B, FIG. 13, or FIG. 14) oriented in a first direction, a second surface (e.g., the second surface 406 in FIG. 4A, FIG. 6, FIG. 7A, FIG. 8A, FIG. 8B, FIG. 13, or FIG. 14) facing a second direction opposite the first direction, and a through hole (e.g., the through hole 402 in FIG. 4A, FIG. 6, FIG. 7A, FIG. 8A, FIG. 8B, FIG. 13, or FIG. 14); and an antenna module disposed in the main board. The antenna module includes: a first board (e.g., the first board 410 in FIG. 4A, FIG. 6, FIG. 8A, FIG. 8B, FIG. 13, or FIG. 14) at least partially disposed in the first through hole and including a plurality of antenna elements (e.g., the antenna elements 420 in FIG. 4A, FIG. 6, FIG. 8A, FIG. 8B, FIG. 13, or FIG. 14); a second board (e.g., the second board 440 in FIG. 4F, FIG. 13, or FIG. 14) disposed on the second surface of the main board and electrically connected to the first board; and a wireless communication circuit (e.g., the wireless communication circuit 430 in FIG. 4F, FIG. 13, or FIG. 14) configured to transmit and/or receive a wireless signal in a predetermined frequency band via the plurality of antenna elements.

According to various example embodiments, the second board may be disposed to at least partially overlap the main board when the first surface of the main board is viewed from above.

According to various example embodiments, the second board may include a second through hole (e.g., the second through hole 1300 in FIG. 13), and the antenna module may further include a third board (e.g., the third board 1310 in FIG. 13) disposed in the second through hole and including a plurality of other antenna elements (e.g., the plurality of other antenna elements 1321 and/or 1323 in FIG. 13) disposed at a predetermined interval).

According to various example embodiments, the electronic device may further include an amplification circuit (e.g., the amplification circuit 1410 in FIG. 14), and the amplification circuit may include a second through hole (e.g., the second through hole 1400 in FIG. 14) included in the second board.

According to various example embodiments of the disclosure, an electronic device is configured such that a plurality of antenna elements, a first board including the plurality of antenna elements, and/or a wireless communication circuit are at least partially disposed in a through hole provided in a main board in an electronic device. Therefore, it is possible to secure a space in which an array antenna and/or a wireless communication circuit are disposed and to reduce impedance matching loss and/or insertion loss caused by the main board.

Further examples in accordance with the disclosure are set forth below.

According to various embodiments, an electronic device includes: a first board including a first surface oriented in a first direction, a second surface facing away from the first surface, and one or more through holes and/or cut-out portions; and an antenna module including one or more antenna elements, and a wireless communication circuit configured to transmit and/or receive a wireless signal via the one or more antenna elements, wherein at least a part of the antenna module is at least partially disposed in the one or more through holes and/or cut-out portions.

According to various embodiments, the electronic device of the immediately preceding paragraph, the electronic device may further include a housing, wherein the first board may be disposed in an internal space of the housing.

According to various embodiments, the electronic device of the preceding two paragraphs, the first board may be a main board.

According to various embodiments, the electronic device of the preceding three paragraphs, the antenna module may be disposed on the first board.

According to various embodiments, the electronic device of the preceding four paragraphs, the antenna module may further include a second board including the one or more antenna elements.

According to various embodiments, the electronic device of the immediately preceding paragraph, the second board may be at least partially disposed in the through hole.

According to various embodiments, the electronic device of the preceding six paragraphs, the wireless communication circuit may be configured to transmit and/or receive the wireless signal in a predetermined frequency band.

According to various embodiments, the electronic device of the preceding seven paragraphs, the wireless communication circuit may be disposed on the second surface of the first board.

According to various embodiments, the electronic device of the preceding eight paragraphs, at least a part of one or more of the wireless communication circuit, the one or more antenna elements, and the second board is at least partially disposed in the one or more through holes and/or cut-out portion.

According to various embodiments, the electronic device of the preceding eight paragraphs, the second board may protrude from the first surface of the first board.

According to various embodiments, the electronic device of the preceding nine paragraphs, a surface of the second board may be substantially coplanar with, or recessed relative to the first surface of the first board.

According to various embodiments, the electronic device of the preceding eleven paragraphs, the wireless communication circuit may be disposed so as to at least partially overlap the first board when the first surface of the first board may be viewed in a direction opposite the first direction.

According to various embodiments, the electronic device of the preceding eleven paragraphs, the second board and the wireless communication circuit may be electrically and/or physically coupled to each other through a conductive bond.

According to various embodiments, the electronic device of the preceding thirteen paragraphs, the wireless communication circuit may be coupled or connected to the first board.

According to various embodiments, the electronic device of the preceding thirteen paragraphs, the second board may be coupled or connected to the wireless communication circuit.

According to various embodiments, the electronic device of the preceding two paragraphs, the wireless communication circuit may be coupled or connected to the first board through a conductive bond.

According to various embodiments, the electronic device of the preceding sixteen paragraphs, the first board may include at least one circuit.

According to various embodiments, the electronic device of the preceding immediately paragraph, the wireless communication circuit may be electrically connected to the at least one circuit via the first board.

According to various embodiments, the electronic device of the preceding two paragraphs, the at least one circuit may include a communication processor and/or a power management circuit.

According to various embodiments, the electronic device of the preceding nineteen paragraphs, the electronic device may further include an interposer disposed between the first board and the wireless communication circuit.

According to various embodiments, the electronic device of the preceding immediately paragraph, the wireless communication circuit may be electrically connected to the first board via the interposer.

According to various embodiments, the electronic device of the preceding twenty paragraphs, at least one matching circuit disposed between the second board and the wireless communication circuit and electrically connected to the one or more antenna elements.

According to various embodiments, the electronic device of the preceding immediately paragraph, the matching circuit may include one or more conductive patterns disposed on the second board and/or the wireless communication circuit.

According to various embodiments, the electronic device of the preceding immediately paragraph, the one or more conductive patterns disposed on the second board and/or the wireless communication circuit may be disposed so as not to overlap each other when the first surface of the first board is viewed in a direction opposite the first direction.

According to various embodiments, the electronic device of the preceding twenty three paragraphs, the second board may be made of a material having a dielectric constant lower than a dielectric constant of the first board.

According to various embodiments, the electronic device of the preceding twenty five paragraphs, the antenna module may further include: a third board comprising one or more other antenna elements electrically connected to the wireless communication circuit.

According to various embodiments, the electronic device of the preceding immediately paragraph, the electronic device may further include an interposer disposed between the wireless communication circuit and the third board.

According to various embodiments, the electronic device of the preceding immediately paragraph, the wireless communication circuit may be disposed between the second board and the third board and electrically connected to the one or more other antenna elements via the interposer and the third board.

According to various embodiments, the electronic device of the preceding three paragraphs, the other antenna elements may be disposed at a predetermined interval.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic device comprising:
a first board comprising one or more through holes and/or cut-out portions;
an antenna module comprising one or more antenna elements; and
a wireless communication circuit configured to transmit and/or receive a wireless signal via the one or more antenna elements,
wherein at least a part of the antenna module is at least partially disposed in the one or more through holes and/or cut-out portions.

2. The electronic device of claim 1, further comprising a housing, wherein the first board is disposed in an internal space of the housing.

3. The electronic device of claim 1, wherein the first board is a main board.

4. The electronic device of claim 1, wherein the first board comprises a first surface and a second surface facing in an opposite direction to the first surface,
wherein the antenna module further comprises a second board including the one or more antenna elements,
wherein at least a part of the second board is at least partially disposed in the one or more through holes and/or cut-out portions, a third surface of the second board protruding from the first surface of the first board, and
wherein the wireless communication circuit is disposed on the second surface of the first board.

5. The electronic device of claim 4, wherein the wireless communication circuit is disposed to at least partially overlap the first board when the first surface of the first board is viewed from above.

6. The electronic device of claim 4, wherein the second board and the wireless communication circuit are electrically and/or physically coupled to each other through a conductive bond.

7. The electronic device of claim 4, wherein the wireless communication circuit is connected to the first board, and
wherein the second board is connected to the wireless communication circuit.

8. The electronic device of claim 4, further comprising:
at least one matching circuit disposed between the second board and the wireless communication circuit and electrically connected to the one or more antenna elements.

9. The electronic device of claim 8, wherein the matching circuit comprises one or more conductive patterns disposed on the second board and/or the wireless communication circuit.

10. The electronic device of claim 9, wherein the one or more conductive patterns disposed on the second board and/or the wireless communication circuit are disposed to not overlap each other when the first surface of the first board is viewed from above.

11. The electronic device of claim 4, wherein the second board comprises a material having a dielectric constant lower than a dielectric constant of the first board.

12. The electronic device of claim 4, wherein the second board comprises a material having a dielectric constant lower than a dielectric constant of the first board and the wireless communication circuit is disposed between the second board and the third board and electrically connected to the one or more other antenna elements via the interposer and the third board.

13. The electronic device of claim 1, wherein the first board comprises at least one circuit, and
wherein the wireless communication circuit is electrically connected to the at least one circuit via the first board.

14. The electronic device of claim 13, wherein the at least one circuit comprises a communication processor and/or a power management circuit.

15. The electronic device of claim 1, further comprising:
an interposer disposed between the first board and the wireless communication circuit, and wherein the wireless communication circuit is electrically connected to the first board via the interposer.

16. The electronic device of claim 1, wherein the antenna module further comprises:
a third board comprising one or more other antenna elements electrically connected to the wireless communication circuit.

17. The electronic device of claim 16, further comprising an interposer disposed between the wireless communication circuit and the third board.

18. The electronic device of claim 16, wherein the other antenna elements are disposed at a predetermined interval.

19. The electronic device of claim 1, wherein the first board comprising a first surface and a second surface facing in an opposite direction to the first surface,
wherein the antenna module further comprises a second board including the one or more antenna elements,
wherein the second board is disposed in the one or more through holes and/or cut-out portions, a third surface of the second board being disposed so as to be coplanar with the first surface of the first board, and
wherein the wireless communication circuit is disposed on the second surface of the first board.

20. The electronic device of claim 1, wherein the first board comprising a first surface and a second surface facing in an opposite direction to the first surface,
wherein the antenna module further comprises a second board including the one or more antenna elements,
wherein the second board is disposed in the one or more through holes and/or cut-out portions, a third surface of the second board being disposed so as to be lower than the first surface of the first board, and
wherein the wireless communication circuit is disposed on the second surface of the first board.

* * * * *